(12) United States Patent
Fischer

(10) Patent No.: US 9,411,239 B2
(45) Date of Patent: Aug. 9, 2016

(54) ILLUMINATION OPTICAL UNIT FOR EUV PROJECTION LITHOGRAPHY

(71) Applicant: Carl Zeiss SMT GmbH, Oberkochen (DE)

(72) Inventor: Thomas Fischer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/667,041

(22) Filed: Mar. 24, 2015

(65) Prior Publication Data

US 2015/0192860 A1 Jul. 9, 2015

Related U.S. Application Data

(63) Continuation of application No. PCT/EP2013/072496, filed on Oct. 28, 2013.

(60) Provisional application No. 61/725,711, filed on Nov. 13, 2012.

(30) Foreign Application Priority Data

Nov. 13, 2012 (DE) .......................... 10 2012 220 597

(51) Int. Cl.
*G03B 27/54* (2006.01)
*G03F 7/20* (2006.01)
(Continued)

(52) U.S. Cl.
CPC .......... *G03F 7/70058* (2013.01); *G02B 5/0891* (2013.01); *G02B 5/09* (2013.01);
(Continued)

(58) Field of Classification Search
CPC ............ G03F 7/70141; G03F 7/70075; G03F 7/70058
USPC ................................................ 355/53, 67–71
See application file for complete search history.

(56) References Cited

U.S. PATENT DOCUMENTS 6,658,084 B2 12/2003 Singer
6,859,515 B2 2/2005 Schultz et al.
(Continued)

FOREIGN PATENT DOCUMENTS

DE 10 2009 054 540 A1 6/2011
DE 10 2010 029 765 A1 12/2011
(Continued)

OTHER PUBLICATIONS

German Office Action, with translation thereof, for corresponding DE Appl No. 10 2012 220 597.7, dated Jun. 11, 2013.
(Continued)

*Primary Examiner* — Hung Henry Nguyen
(74) *Attorney, Agent, or Firm* — Fish & Richardson P.C.

(57) ABSTRACT

An illumination optical unit for EUV projection lithography has a first and second facet mirrors, each with a plurality of reflecting facets on a support. The facets of the first facet mirror can be switched between various tilt positions. In each tilt position, the tiltable first facet is assigned to a second facet of the second facet mirror for deflecting EUV radiation in the direction of this second facet. Each of the first facets is assigned to a set of second facets by its tilt positions. The two facet mirrors are arranged so that an arrangement distribution of second facets, impinged upon via the first facets, results in an illumination-angle distribution of an illumination of an illumination field.

28 Claims, 15 Drawing Sheets

(51) Int. Cl.
  *G02B 5/08* (2006.01)
  *G02B 5/09* (2006.01)
  *G02B 19/00* (2006.01)
  *G02B 26/08* (2006.01)

(52) U.S. Cl.
  CPC ....... *G02B 19/0023* (2013.01); *G02B 19/0095* (2013.01); *G02B 26/0816* (2013.01); *G03F 7/70075* (2013.01); *G03F 7/70116* (2013.01)

(56) References Cited

U.S. PATENT DOCUMENTS

2005/0174650 A1* 8/2005 Melzer ............... G02B 26/0816
  359/627
2011/0141445 A1 6/2011 Endres et al.
2011/0228244 A1* 9/2011 Mann ................. G02B 27/0905
  355/67

FOREIGN PATENT DOCUMENTS

| DE | 10 2011 076 658 A1 | 5/2012 |
| EP | 1 225 481 A | 7/2002 |
| WO | WO 2010/003527 A1 | 1/2010 |

OTHER PUBLICATIONS

International Search Report for corresponding PCT Appl No. PCT/EP2013/072496, dated Mar. 12, 2014.

* cited by examiner

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2013/072496, filed Oct. 28, 2013, which claims benefit under 35 USC 119 of German Application No. DE 10 2012 220 597.7, filed Nov. 13, 2012. International application PCT/EP2013/072496 also claims priority under 35 USC 119(e) to U.S. Provisional Application No. 61/725,711, filed Nov. 13, 2012. The contents of international application PCT/EP2013/072496 and German patent application DE 10 2012 220 597.7 are incorporated herein by reference.

The invention relates to an illumination optical unit for EUV projection lithography. The invention furthermore relates to a method for prescribing an assignment of first facets to second facets in such an illumination optical unit, an optical system with such an illumination optical unit, a projection exposure apparatus with such an optical system, a method for producing a microstructured or nanostructured component using such a projection exposure apparatus and a component structured using such a production method.

A projection exposure apparatus with an illumination optical unit is known from DE 10 2009 054 540 A1. In order to flexibly prescribe illumination settings, i.e. illumination-angle distributions for illuminating structures imaged during projection lithography, use is made of tiltable first facets. What is required is a change between the various illumination settings.

It is an object of the present invention to develop an illumination optical unit of the type mentioned at the outset in such a way that it is possible to change between different prescribed illumination settings with little outlay.

According to the invention, this object is achieved by an illumination optical unit for EUV projection lithography for illuminating an illumination field with a first facet mirror with a plurality of first reflecting facets on a support, and with a second facet mirror with a plurality of second reflecting facets on a support. At least some of the first facets can be switched between various tilt positions. In each tilt position of the respective tiltable first facet, this first facet is assigned to a second facet for deflecting EUV radiation in the direction of this second facet. Each of the tiltable first facets is assigned to a set of second facets by its tilt positions. The two facet mirrors are arranged in such a way that an arrangement distribution of second facets, on which EUV radiation can impinge in a given tilt position configuration of the first facets, results in an illumination-angle distribution of an illumination of the illumination field. The second facets belonging to each of the sets of second facets lie within a circle on the second facet mirror, the diameter of which circle is less than 70% of an overall diameter of an overall arrangement of all second facets on the second facet mirror.

The illumination-angle distribution, resulting from the arrangement distribution of the second facets which can be impinged upon with EUV radiation via the given tilt position configuration of the first facets, is also referred to as illumination setting. As a result of in each case arranging the second facets within a circle on the second facet mirror, the diameter of which circle is less than 70% of the overall diameter of the overall arrangement of all second facets, the first facets can be arranged in such a way that, proceeding from a home position, a maximum tilt angle for impinging upon all second facets belonging to the set of second facets assigned to this first facet can be kept as small as possible. A corresponding small maximum tilt angle for the tiltable first facets reduces the requirements demanded of the mechanical system of the tiltable first facets. Moreover, it is possible to select the illumination geometry in such a way that the first facets deflect the EUV radiation on all facets of the assigned set of second facets with very similar angles of incidence on the first facet. The light with substantially the same tilt angle can then be deflected on the first facets, independently of their respective tilt position. The first facets can then, in particular, carry highly reflective coatings, for example multilayer coatings, which are matched to precisely this tilt angle. There can then be a reflection of the EUV radiation with the greatest degree of reflection on the tiltable first facets. A maximum reflection difference on a first facet when deflecting the EUV radiation in the various tilt positions of the first facet can then lie at, at most, 15%, at, at most, 10% or else at, at most, 5%. The diameter of the circle on the second facet mirror, within which the second facets of each of the sets of second facets lie, can be less than 65%, can be less than 60%, can be less than 55% and can also be less than 50% of the overall diameter of the overall arrangement of all second facets.

All first facets on the first facet mirror can be switched between different tilt positions. Alternatively, it is also possible for only some of the first facets on the first facet mirror to be switchable between various tilt positions. The switchable first facets can be switched between the same number of different tilt positions or else between different numbers of different tilt positions. The first facets can be switched between two tilt positions. In one variant of the first facet mirror, at least some first facets can be switched between more than two tilt positions, for example between three tilt positions, between four tilt positions, between five tilt positions, between six tilt positions or between even more tilt positions.

A symmetry set of the second facets can belong to each of the sets of the second facets, which symmetry set, in relation to a center of the second facet mirror, is arranged with point symmetry with respect to the set of the second facets. Such symmetrization of an assignment of the tiltable facets on the first facet mirror to the second facets on the second facet mirror significantly reduces the outlay when prescribing suitable assignments in order to achieve a specific set of different illumination settings by a corresponding tilt of the first facets. The sets of the second facets arranged with point symmetry with respect to one another in each case contain at least two second facets. This number of second facets within each set corresponds to the number of tilt positions of the first facets, via which the EUV radiation is deflected in the direction of the second facets. The symmetrization according to the invention renders it possible to restrict the assignment problem to a half space of the facets, with the assignment in the other half space emerging automatically due to the point symmetry prescription.

Every set can include more than two second facets. Such sets of the second facets with more than two second facets are used when the first facets can accordingly be switched between more than two tilt positions. The first facets can be tri-state facets, i.e. facets with three tilt positions. The first facet mirror can have some first facets which can be switched between two tilt positions and some first facets which can be switched between three tilt positions.

The arrangement of the sets on the second facet mirror can be such that this results in at least three arrangement distributions of the second facets, the innermost second facets of which, as seen from a center of the second facet mirror, lie on a radius which is greater than 42% of half the overall diameter of the overall arrangement of all second facets on the second facet mirror, wherein an overall reflection area of connected pupil facet groups of these arrangement distributions of the second facets is less than 40% of an overall reflection area of the overall arrangement of all second facets, and wherein at least three of the arrangement distributions differ from one another by at least 5% in terms of their reflection areas, in each case in all quadrants of the overall arrangement of all second facets. Such an arrangement of the sets of the second facets enables a particularly flexible prescription of different arrangement distributions of the second facets and hence different illumination settings. The three arrangement distributions, i.e. the three illumination settings, can, for example, be two dipole settings and one quadrupole setting. In the case of such multi-pole illumination settings, an illumination of the illumination field emerges from the direction of a corresponding number of illumination poles, which are formed by connected groups of second facets impinged upon by the EUV radiation. The ratio of the radius of the innermost second facets to half the overall diameter of the overall arrangement corresponds to a lower bound of the value sigma in accordance with the definition from U.S. Pat. No. 6,658,084 B2, i.e. a lower bound for the illumination angle when illuminating the illumination field. The radius of the innermost second facets can be greater than 45%, can be greater than 50%, can be greater than 60%, can be greater than 70% and can be greater than 80% of half the overall diameter of the overall arrangement of all second facets. A correspondingly large radius of the innermost second facets leads to correspondingly large illumination angles, which is suitable for specific, challenging illumination objects. The proportion of the overall reflection area of a respective connected pupil facet group of the respective arrangement distribution can be less than 30% and can be less than 25% of the overall reflection area of the overall arrangement of all second facets. A correspondingly small reflection area proportion leads to a correspondingly defined illumination direction from the direction of the respective illumination pole. The difference of the at least three arrangement distributions, i.e. the at least three illumination settings attainable via the illumination optical unit by appropriate tilting of the first facets, in terms of their reflection areas, respectively in all quadrants of the overall arrangement of all second facets, can be at least 10%, can be at least 15%, can be at least 20%, can be at least 25% and can also be even greater. The features "minimum radius of the innermost second facets", "maximum overall reflection area of connected pupil facet groups" and "difference of the at least three arrangement distributions in terms of their reflection areas in all quadrants" can also be realized independently of one another, i.e. they need not necessarily all be realized at the same time.

Each set can include exactly three second facets. The second facets of each set can prescribe the corners of a convex polygon. Such illumination optical unit can be realized with small absolute changes in tilt angle in the first facets. Every set of second facets can comprise more than three second facets, for example four second facets, five second facets or six second facets. To the extent that the sets of second facets comprise exactly three second facets, the second facets of these sets can prescribe the corners of an acute-angled triangle.

A method for prescribing an assignment of first facets to second facets in an illumination optical unit described above can include the following steps: prescribing groups of second facets on the second facet mirror, onto which, proceeding from different first facets, EUV radiation can be deflected; and assigning the first facets to the second facets while correspondingly prescribing arrangements of sets of second facets in such a way that only facets from different sets of second facets are arranged in each group. Such an assignment prescription method ensures that all second facets of each illumination setting group can be impinged upon simultaneously. As a result of the point symmetry, it is enough to carry out the assignment for only half of the second facets. The assignment of the remaining second facets then emerges on account of the symmetry condition.

The second facets within each of the sets can be arranged in such a way that a maximum distance between the second facets in the respective set is minimized. the second facets within each of the sets can be arranged in such a way that, for all sets, the second facets in the sets are arranged on the support of the second facet mirror within circular areas with a radius minimized for all sets. The second facets within each of the sets can be arranged in such a way that, for all sets, the second facets in the sets prescribe corners of convex polygons on the support of the second facet mirror. In such methods, the assignment is optimized in such a way that there are the smallest possible demands on the mechanical system of the tiltable facets. Further advantages correspond, in particular, to what was already explained above with reference to the illumination optical unit according to the invention.

Arrangements of second facets which lead to at least some of the following illumination settings are prescribed as the groups of second facets: annular illumination with small illumination angles; annular illumination with mid-sized illumination angles; annular illumination with large illumination angles; x-dipole setting; y-dipole setting; +$\alpha$-dipole setting; −$\alpha$-dipole setting; quadrupole setting; hexapole setting; and conventional setting. Such an assignment prescription method enables flexible tilt prescription of different illumination settings which are particularly suitable for illuminating the structure. In particular, it can be possible to prescribe two, three, four, five, six or even all of these settings. Prescribable illumination settings can also include multi-pole settings with more than two poles. The poles of the dipole or multi-pole settings can be formed as "leaflets". The angle $\alpha$ of the +/−$\alpha$-dipole settings, which pre-scribes a circumferential position of the poles in the circumferential direction about the center of the second facet mirror, can be 25° or else 45°. In principle, the angle $\alpha$ can lie in a region between 20° and 45°. A corresponding statement applies to an angle $\alpha$, defined in the same way, of a quadrupole setting, which angle can lie in a region between 10° and 22.5°. A corresponding statement applies to a hexapole setting with six illumination poles, i.e. with second facets, on which illumination light impinges, on the second facet mirror. It is also possible to realize conventional illumination settings, in which the second facet mirror is, on average, illuminated homogeneously over its entire used surface, which is prescribed by the arrangement of the second facets. This can be achieved either by impinging on all second facets of the second facet mirror with the illumination light or, in the case that there are fewer second facets than first facets, by a correspondingly homogeneously thinned out impingement of the second facets of the second facet mirror.

An optical system can include an illumination optical unit described above and an EUV light source for the illumination light. The advantages of such an optical system, a projection exposure apparatus with such an optical system, a production method using such a projection exposure apparatus and a microstructured or nanostructured component according to such a method correspond to those which were already explained above with reference to the illumination optical unit according to the invention and the assignment prescription method according to the invention.

The projection exposure apparatus can have an object holder with an object displacement drive for displacing the object to be imaged along an object displacement direction. The projection exposure apparatus can have a wafer holder with a wafer displacement drive for displacing a wafer, on which a structure of the object to be imaged is to be imaged, along an image displacement direction. The object displacement direction can extend parallel to the image displacement direction.

Exemplary embodiments of the invention will be explained in more detail below on the basis of the drawing. In the latter:

FIG. 1 schematically shows a meridional section of a microlithographic projection exposure apparatus, in relation to an illumination optical unit;

Figure 1:
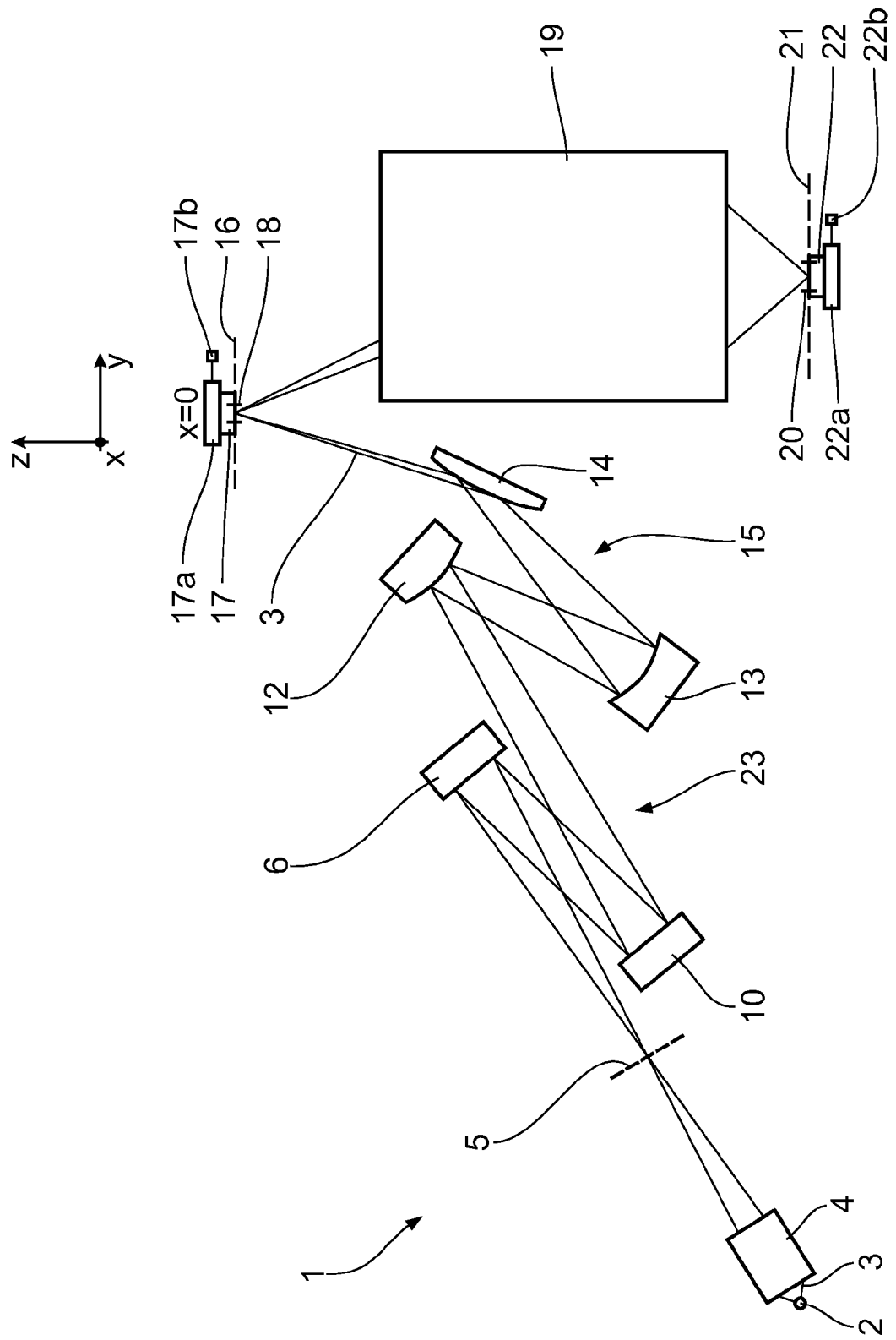
Figure 4:
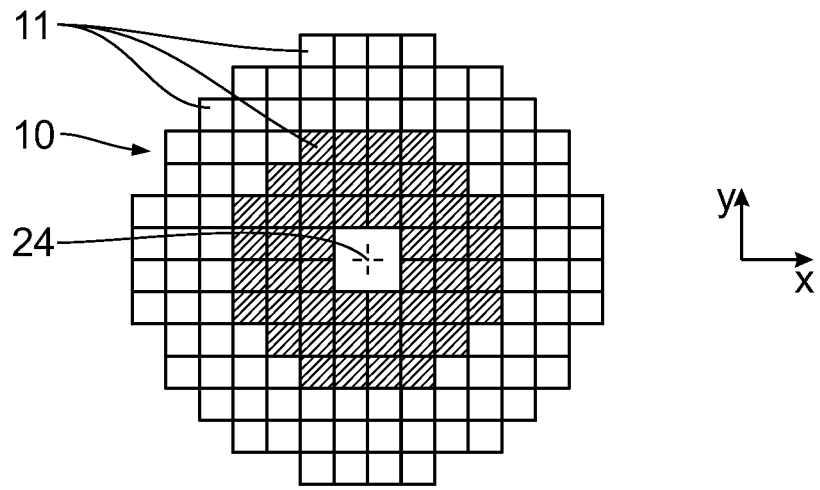
Figure 5:
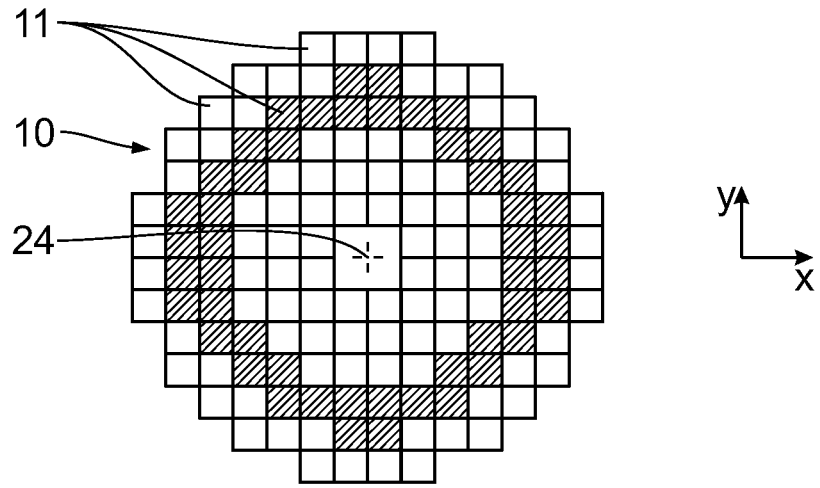
Figure 6:
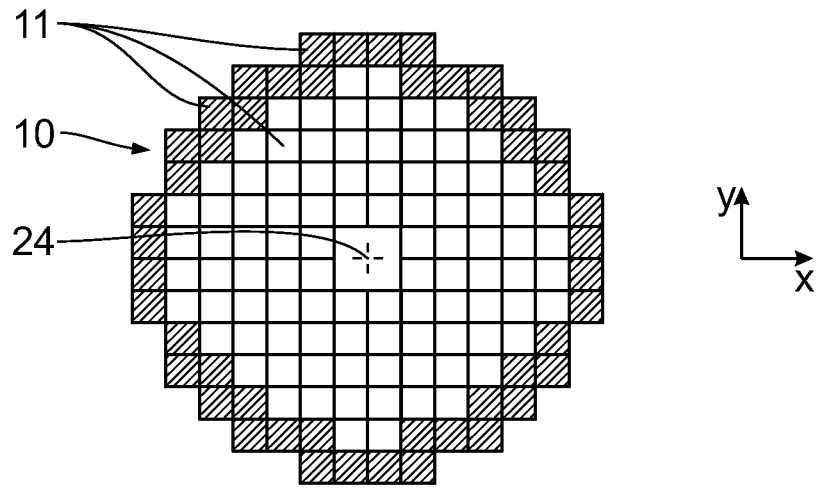
Figure 7:
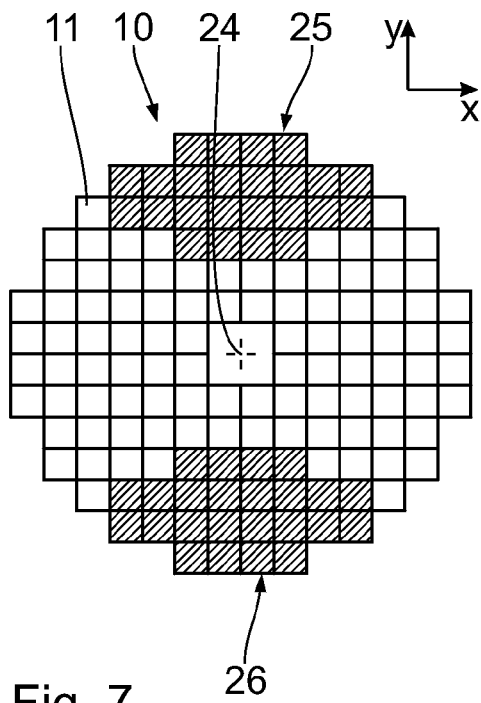
Figure 8:
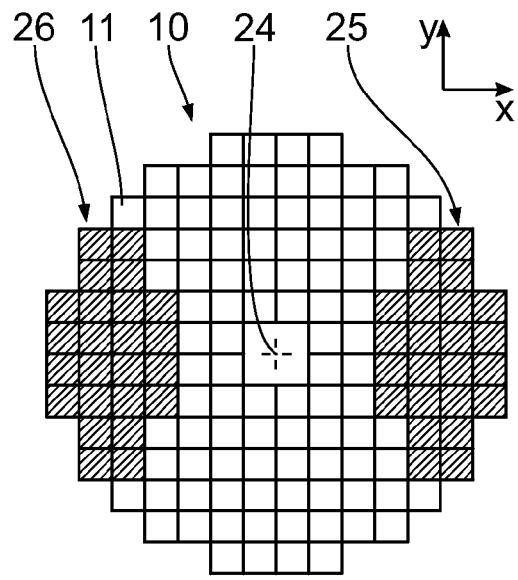
Figure 9:
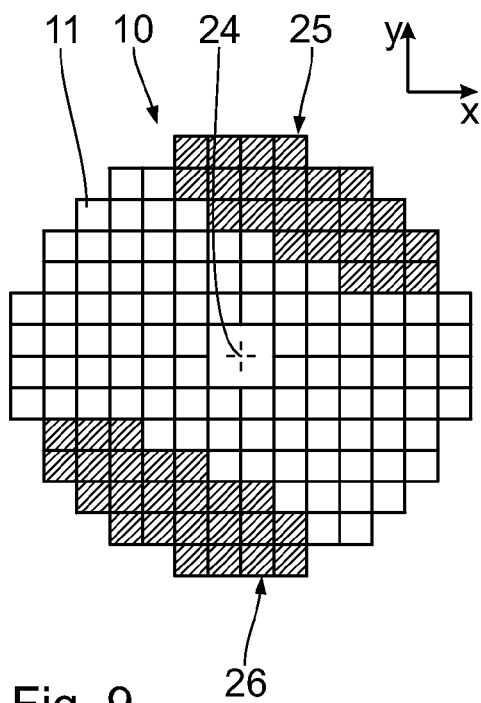
Figure 10:
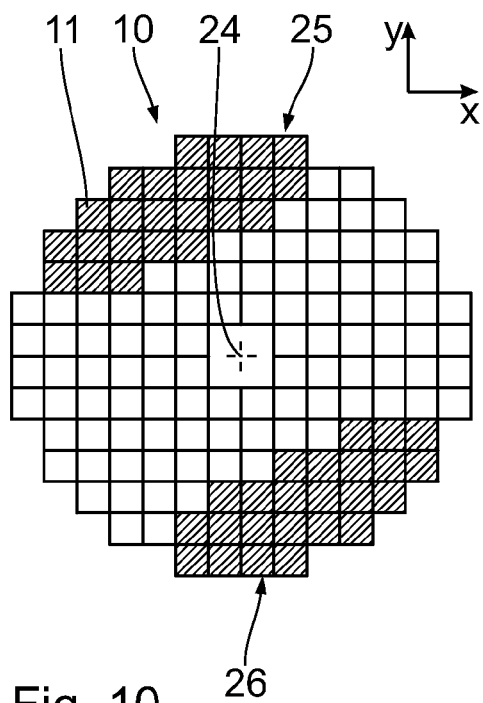
Figure 11:
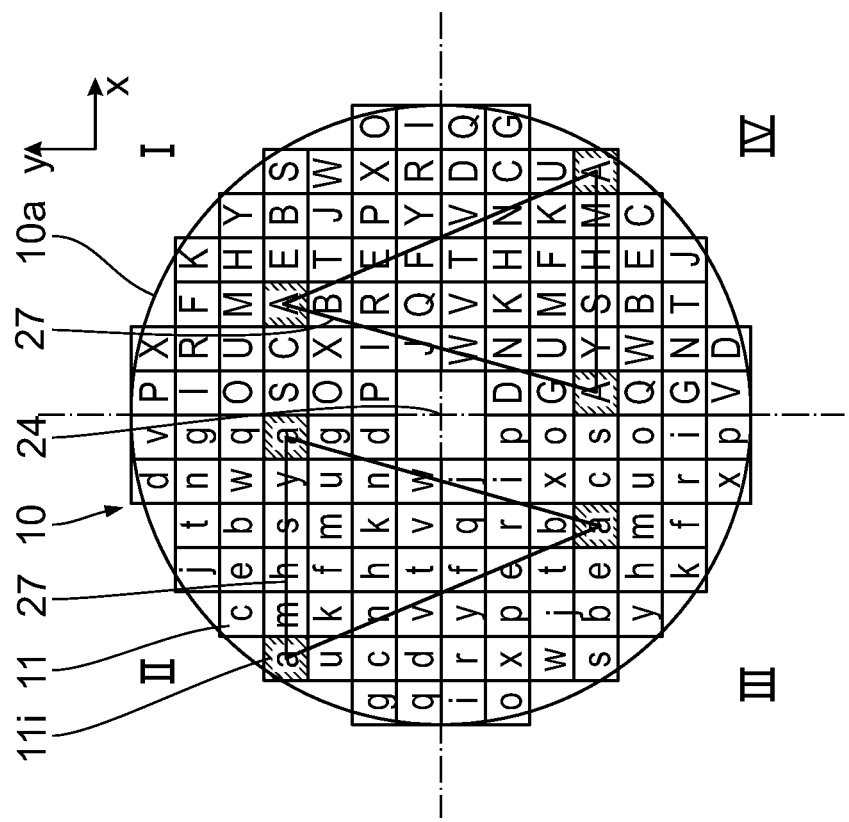
Figure 14:
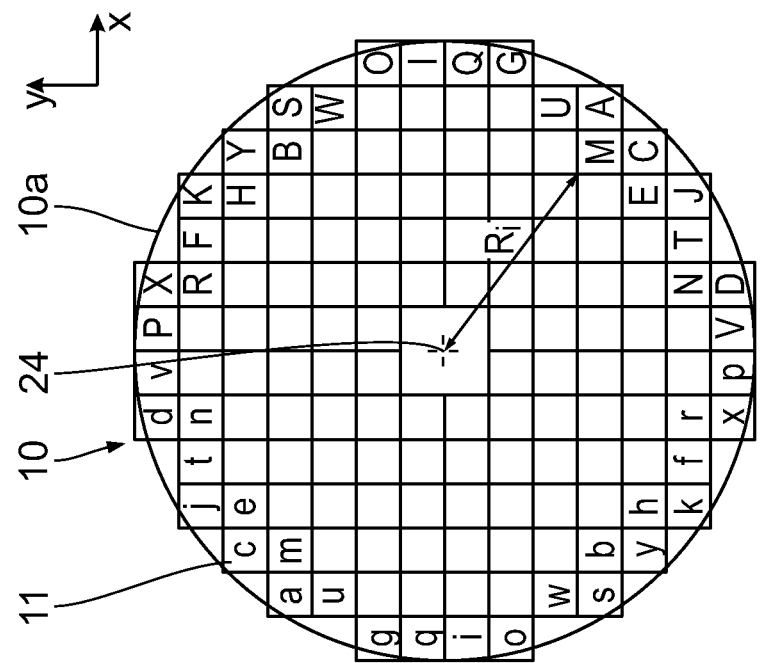
Figures 19, 20:
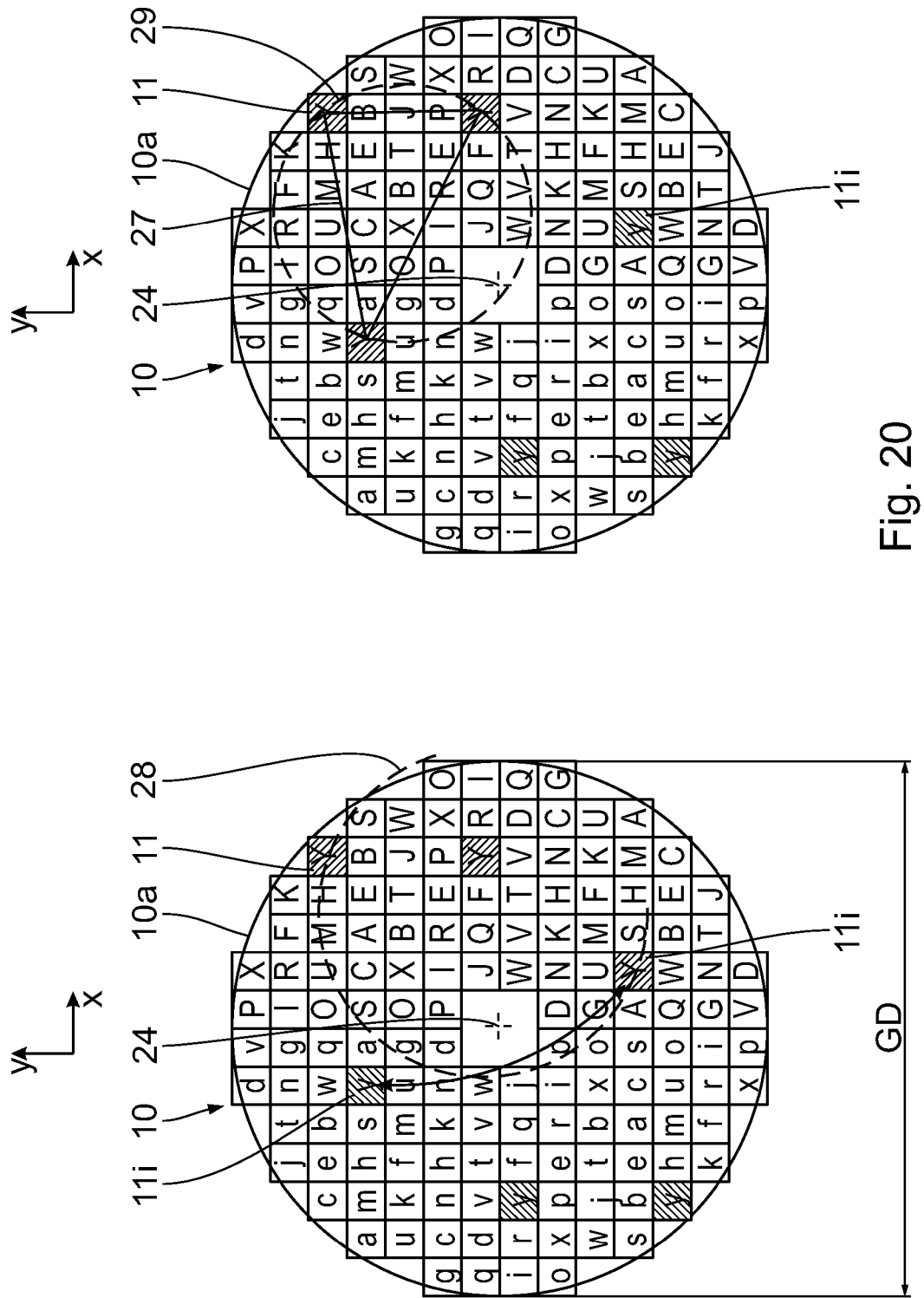
Figure 21:
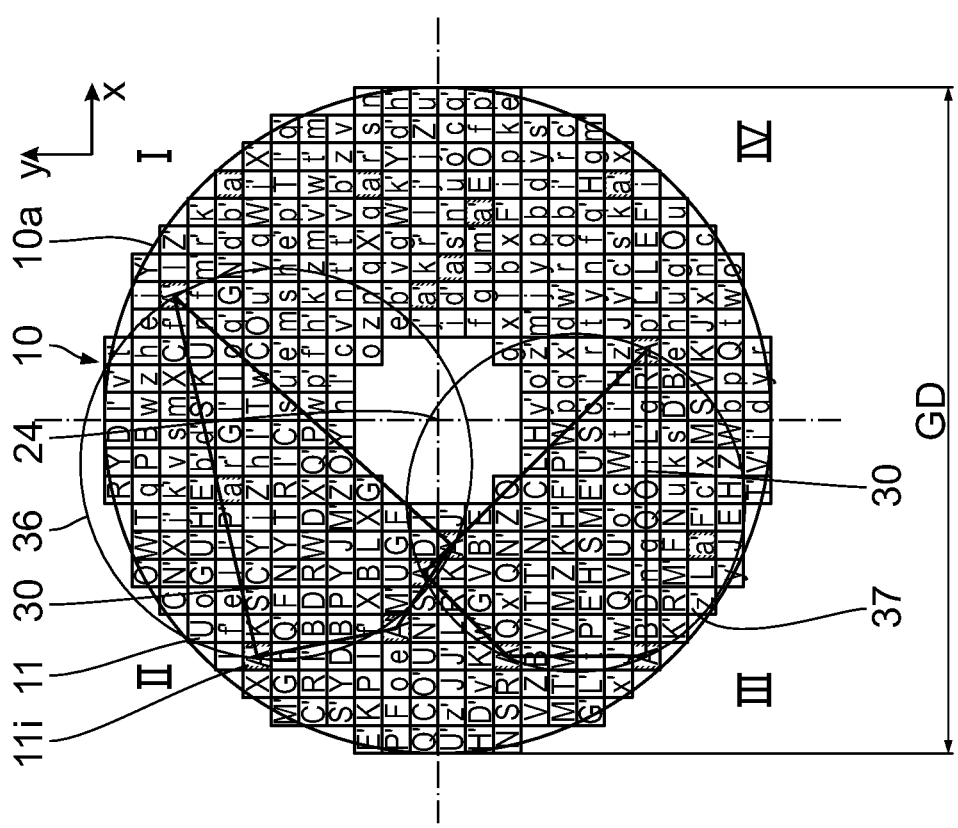

FIG. 4 shows, very schematically and in an exemplary manner, a view of a facet arrangement of a pupil facet mirror of the illumination optical unit of the projection exposure apparatus according to FIG. 1, with facets, which are impinged upon by illumination light via the facets of the field facet mirror and form a facet group, being highlighted, using the example of a "conventional with small illumination angles" illumination setting;

FIG. 5 shows, in an illustration similar to FIG. 4, the pupil facet mirror with an impingement of the pupil facets for generating the "annular illumination-angle distribution with mid-sized illumination angles" illumination setting;

FIG. 6 shows, in an illustration similar to FIG. 4, the pupil facet mirror with an impingement of the pupil facets for generating the "annular illumination-angle distribution with large illumination angles" illumination setting;

FIG. 7 shows, in an illustration similar to FIG. 4, the pupil facet mirror with an impingement of the pupil facets for generating the "y-dipole" illumination setting;

FIG. 8 shows, in an illustration similar to FIG. 4, the pupil facet mirror with an impingement of the pupil facets for generating the "x-dipole" illumination setting;

FIG. 9 shows, in an illustration similar to FIG. 4, the pupil facet mirror with an impingement of the pupil facets for generating the "+25°-dipole" illumination setting;

FIG. 10 shows, in an illustration similar to FIG. 4, the pupil facet mirror with an impingement of the pupil facets for generating the "−25°-dipole" illumination setting;

FIG. 11 schematically shows the pupil facet mirror with a total of 144 pupil facets, with each of the pupil facets being denoted by a letter, wherein the pupil facets denoted with in each case the same letter can be impinged upon by illumination light from different tilt positions of exactly one field facet;

FIGS. 12 to 18 each show, in an illustration similar to FIG. 11, group-by-group impingement examples of the pupil facets for generating illumination settings corresponding to those according to FIGS. 4 to 10, with the assignment of the pupil facets to the tiltable field facets in each case being the same as depicted in FIG. 11;

FIG. 19 shows, in an illustration once again similar to FIG. 11, the pupil facet mirror with the pupil facet assignment to the tiltable field facets indicated by letters, with in each case three pupil facets assigned to the same field facet being highlighted, which pupil facets respectively form a pupil facet set containing three pupil facets due to their assignment to the field facets, wherein the two highlighted pupil facet sets have point symmetry to one another in relation to a center of the pupil facet mirror;

FIG. 20 shows, in an illustration similar to FIG. 19, a modification of the assignment of the pupil facet sets, in each case to one of the tiltable field facets, wherein there has been an exchange of pupil facets for minimizing a field facet deflection angle between the two pupil facet sets according to FIG. 19;

FIG. 21 schematically shows a further embodiment of the pupil facet mirror with a total of 416 pupil facets, with each of the pupil facets being denoted by a letter and optionally by shading, wherein the pupil facets denoted in each case by the same letter and optionally the shading can be impinged upon by illumination light from different tilt positions of exactly one field facet; and FIGS. 22 to 30 each show, in an illustration similar to FIG. 21, group-by-group impingement examples of the pupil facets for generating illumination settings similar to those according to FIGS. 4 to 10, with the assignment of the pupil facets to the tiltable field facets in each case being the same as depicted in FIG. 21.

A microlithographic projection exposure apparatus 1 serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron or a free electron laser (FEL) can also be used for the light source 2. Information concerning a light source of this type can be found by the person skilled in the art in U.S. Pat. No. 6,859,515 B2, for example. EUV illumination light or illumination radiation in the form of an imaging light beam 3 is used for illumination and imaging within the projection exposure apparatus 1. Downstream of the light source 2, the imaging light beam 3 firstly passes through a collector 4, which can be, for example, a nested collector having a multi-shell construction known from the prior art or, alternatively, an ellipsoidally shaped collector, which is then arranged behind the light source 2. A corresponding collector is known from EP 1 225 481 A. Downstream of the collector 4, the EUV illumination light 3 firstly passes through an intermediate focal plane 5, which can be used for separating the imaging light beam 3 from undesired radiation or particle portions. After passing through the intermediate focal plane 5, the imaging light beam 3 firstly impinges on a field facet mirror 6. The field facet mirror 6 constitutes a first facet mirror of the projection exposure apparatus 1.

In order to facilitate the description of positional relationships, a Cartesian global xyz-coordinate system is in each case plotted in the drawing. In FIG. 1, the x-axis extends perpendicular to the plane of the drawing and out of the latter. The y-axis extends toward the right in FIG. 1. The z-axis extends upward in FIG. 1.

In order to facilitate the description of positional relationships in the case of individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems extend parallel to one another. The respective y-axes of the local xyz- or xy-coordinate systems have an angle with respect to the y-axis of the global xyz-coordinate system, which corresponds to a tilting angle of the respective optical component about the x-axis.

Figure 2:
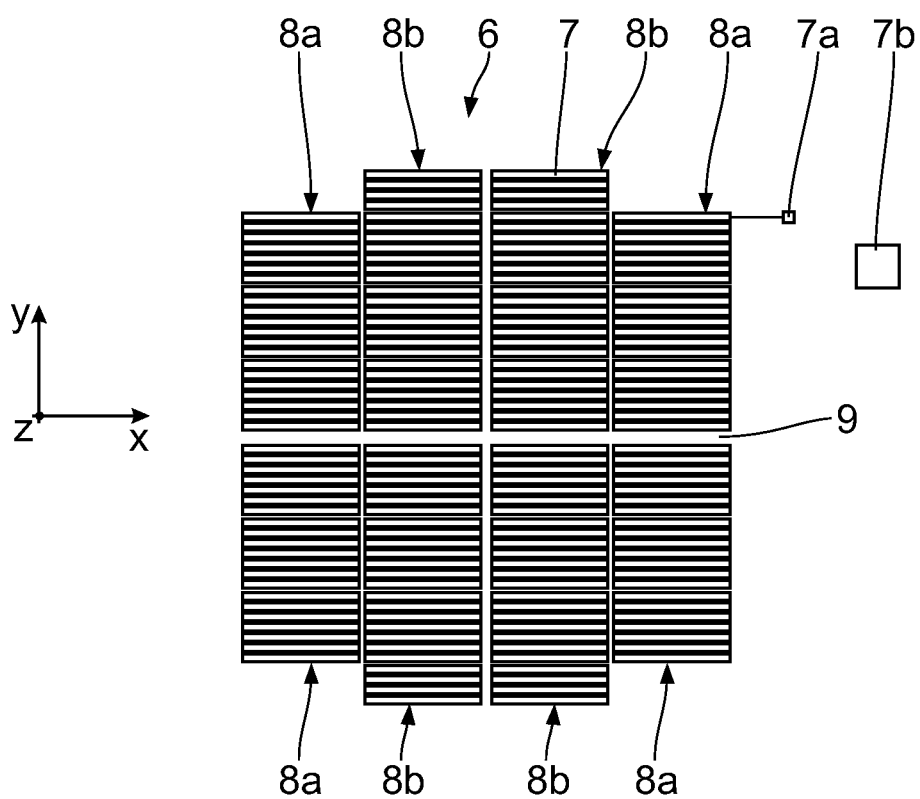
FIG. 2 shows a view of a facet arrangement of a field facet mirror of the illumination optical unit of the projection exposure apparatus according to FIG. 1, in the "rectangular field" embodiment.

FIG. 2 shows, by way of example, a facet arrangement of field facets 7 of the field facet mirror 6 in the "rectangular field" embodiment. The field facets 7 are rectangular and in each case have the same x/y aspect ratio. The x/y aspect ratio can be for example 12/5, can be 25/4, can be 104/8, can be 20/1 or can be 30/1.

The field facets 7 prescribe a reflection area of the field facet mirror 6 and are grouped in four columns each having six to eight field facet groups 8a, 8b. The field facet groups 8a in each case have seven field facets 7. The two additional marginal field facet groups 8b of the two central field facet columns each have four field facets 7. Between the two central facet columns and between the third and fourth facet rows, the facet arrangement of the field facet mirror 6 has interspaces 9, in which the field facet mirror 6 is shaded by holding spokes of the collector 4. If an LPP source is used as the light source 2, corresponding shading can also arise as a result of a tin droplet generator which is arranged adjacent to the collector 4 and is not illustrated in the drawing.

Figure 3:
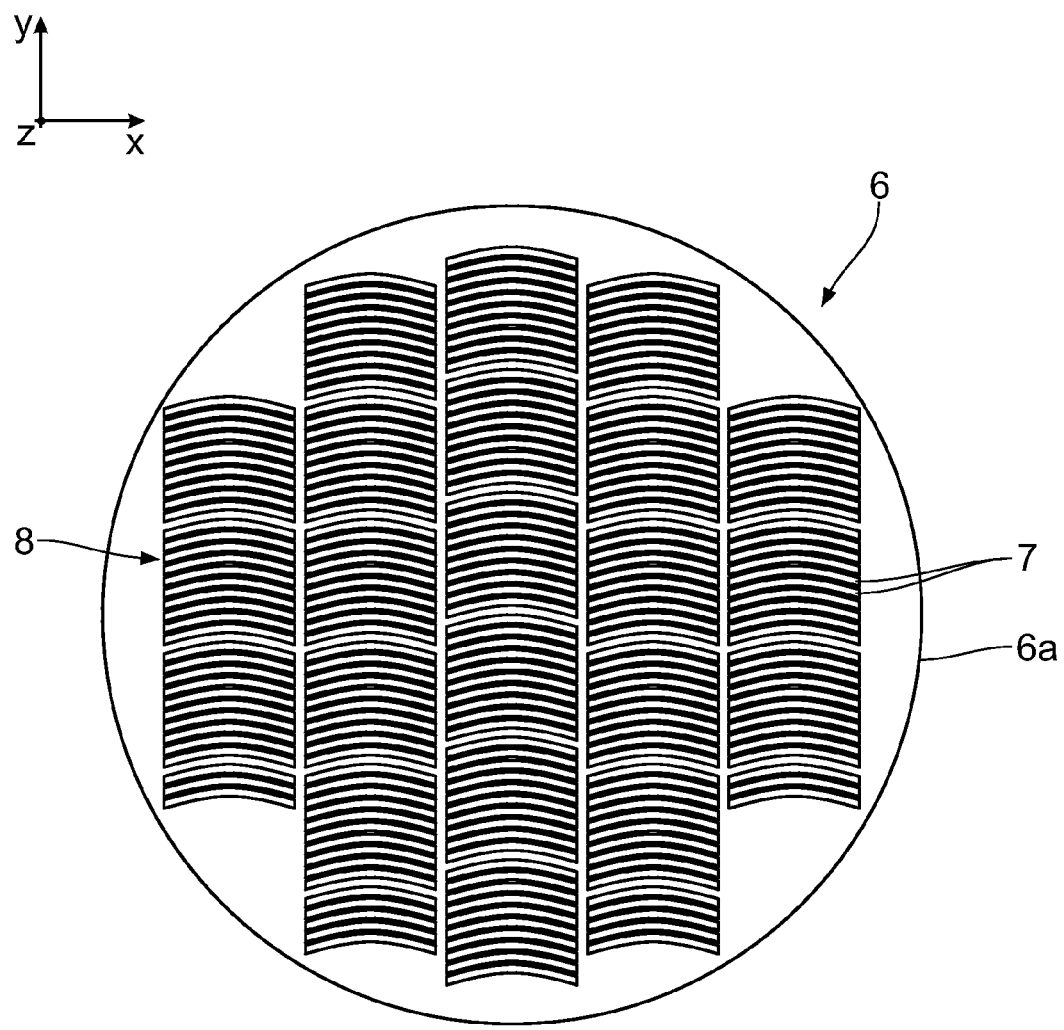
FIG. 3 shows, in an illustration similar to FIG. 2, a facet arrangement of a further embodiment of a field facet mirror in the "arcuate field" embodiment.

FIG. 3 shows a further "arcuate field" embodiment of a field facet mirror 6. Components corresponding to those which have been explained above with reference to the field facet mirror 6 according to FIG. 2 bear the same reference signs and will be explained only insofar as they differ from the components of the field facet mirror 6 according to FIG. 2.

The field facet mirror 6 according to FIG. 3 has a field facet arrangement having arcuate field facets 7. The field facets 7 are arranged in a total of five columns each having a plurality of field facet groups 8. The field facet arrangement is inscribed in a circular boundary of a carrier plate 6a of the field facet mirror.

The field facets 7 of the embodiment according to FIG. 3 all have the same area and the same ratio of width in the x-direction and height in the y-direction, which corresponds to the x/y aspect ratio of the field facets 7 of the embodiment according to FIG. 2.

The field facets 7 can be switched between three different tilt positions in each case. Depending on the embodiment of the field facet mirror 6, all or else some of the field facets 7 can also be switched between more than three different tilt positions. To this end, each field facet is respectively connected to an actuator 7a, which is illustrated very schematically in FIG. 2. The actuators 7a of all tiltable field facets 7 can be actuated by a central control device 7b, which is likewise depicted schematically in FIG. 2.

After reflection on the field facet mirror 6, the imaging light beam 3, which is divided into imaging light partial beams assigned to the individual field facets 7, impinges on a pupil facet mirror 10. The respective imaging light partial beam of the overall imaging light beam 3 is routed along one imaging light channel in each case.

FIG. 4 shows, very schematically, an exemplary facet arrangement of pupil facets 11 on the pupil facet mirror 10. The pupil facet mirror 10 constitutes a second facet mirror of the projection exposure apparatus 1. The pupil facets 11 are arranged on a support plate 10a of the pupil facet mirror 10. The pupil facets 11 are arranged in an x/y grid around a center in a row-by-row and column-by-column manner. The pupil facets 11 have square reflection areas. Other forms of reflection areas are also possible, for example rectangular, round or polygonal areas, for example hexagonal or octagonal areas. Pupil facets 11 arranged in a diamond shape are also possible.

To each imaging light partial beam of the EUV illumination light 3, reflected by one of the field facets 7 in one of the three tilt positions, is assigned exactly one pupil facet 11, and so respectively one impinged upon facet pair with exactly one of the field facets 7 and exactly one of the pupil facets 11 prescribes the imaging light channel for the associated imaging light partial beam of the EUV illumination light 3. Thus, in each tilt position of the respective field facet 7, to this field facet 7 is assigned exactly one pupil facet 11 for deflecting the EUV illumination light 3 in the direction of this pupil facet 11.

The channel-by-channel assignment of the pupil facets 11 to the field facets 7 takes place dependent on a desired illumination by the projection exposure apparatus 1. As a result of the three possible field facet tilt positions, each of the field facets 7 can therefore prescribe three different imaging light channels. Via all its tilt positions, to each one of the field facets 7 is assigned a set of pupil facets 11 whose number corresponds to the number of tilt positions. In the explanation relating to FIG. 11 ff., yet to be described below, each of these pupil facet sets is indicated by exactly one lowercase letter (a, b, c . . . ) or by exactly one uppercase letter (A, B, C . . . ).

In an alternative embodiment, the field facets 7 can also be switched between two tilt positions, between four tilt positions or between even more tilt positions and can, as a result of this, in each case prescribe one imaging light channel. The number of pupil facets 11 in the respective pupil facet set is then correspondingly larger.

In addition to field facets 7 which can be switched between several tilt positions, the field facet mirror 6 can also have field facets 7 which cannot be switched but which are rather fixedly assigned to respectively one pupil facet. Such a variant with field facets 7 that cannot be switched is used, in particular, if the various illumination settings to be prescribed intersect one another such that, in all illumination settings to be prescribed, light is required from specific same directions such that specific pupil facets are always impinged upon by the EUV illumination light, independent of the illumination setting to be prescribed.

In FIG. 4, those pupil facets 11 of the pupil facet mirror 10 are highlighted, which are impinged upon by the illumination light 3 as a result of a current tilt position of the field facets 7. This results in a corresponding illumination setting, i.e. a distribution over the whole pupil facet mirror 10 of the pupil facets 11 impinged upon by the illumination light 3. This illumination setting corresponds to an illumination-angle distribution, which can be prescribed by the projection exposure apparatus 1. The pupil facets 11 impinged upon by the illumination light 3 form at least one connected pupil facet group in the case of each illumination setting. In principle, depending on the current tilt positions of the field facets 7, it is also possible to realize illumination settings with non-connected distributions of pupil facets 11 impinged upon by the illumination light 3. Mixed forms of illumination settings with at least one connected pupil facet group and with at least one isolated impinged-upon pupil facet 11 are also possible. Such an illumination setting having isolated impinged-upon pupil facets 11 can be realized in cases where there is a significantly larger number of pupil facets compared to the number of field facets, wherein, with the lower number of field facets, the pupil facets on the pupil facet mirror 10 should, for example, be impinged upon as homogeneously as possible. To the extent that the illumination setting has at least one connected pupil facet group, this pupil facet group contains at least two pupil facets 11.

The field facets 7 are imaged in an object plane 16 of the projection exposure apparatus 1 via the pupil facet mirror 10 (FIG. 1) and a downstream transmission optical unit 15 consisting of three EUV mirrors 12, 13, 14. The EUV mirror 14 is embodied as a grazing incidence mirror. Arranged in the object plane 16 is a reticle 17, from which an illumination area which coincides with an object field 18 of a downstream projection optical unit 19 of the projection exposure apparatus 1 is illuminated by the EUV illumination light 3. The illumination area is also referred to as illumination field. Depending on the specific embodiment of an illumination optical unit of the projection exposure apparatus 1, the object field 18 is rectangular or arcuate. The imaging light channels are superimposed in the object field 18. The EUV illumination light 3 is reflected by the reticle 17. The reticle 17 is held by an object holder 17a, which can be displaced along the displacement direction y, driven with the aid of a schematically indicated object displacement drive 17b.

To the extent that the pupil facet mirror 10 is arranged directly in an entry pupil of the projection optical unit 19, it is possible to dispense with the transmission optical unit 15.

The projection optical unit 19 images the object field 18 in the object plane 16 in an image field 20 in an image plane 21. Arranged in this image plane 21 is a wafer 22, which carries a light-sensitive layer which is exposed during the projection exposure via the projection exposure apparatus 1. The wafer 22, i.e. the substrate on which imaging takes place, is held by a wafer or substrate holder 22a, which can be displaced synchronously with the displacement of the object holder 17a along the displacement direction y with the aid of a likewise schematically indicated wafer displacement drive 22b. During the projection exposure, both the reticle 17 and the wafer 22 are scanned synchronized in the y-direction. The projection exposure apparatus 1 is embodied as a scanner. The scan direction y is the object displacement direction.

The field facet mirror 6, the pupil facet mirror 10 and the mirrors 12 to 14 of the transmission optical unit 15 are components of an illumination optical unit 23 of the projection exposure apparatus 1. Together with the projection optical unit 19, the illumination optical unit 23 forms an illumination system of the projection exposure apparatus 1.

FIGS. 4 to 10 show different illumination settings, i.e. different groupings of pupil facets 11 impinged upon on the pupil facet mirror 10 by the illumination light 3 via a corresponding prescription of field facet tilt mirrors, with the impinged-upon pupil facets 11 being highlighted.

In the embodiment according to FIG. 4, the pupil facet mirror 10 has a total of one hundred and forty-four pupil facets 11. Assigned to such a pupil facet mirror 10 is an embodiment of the field facet mirror 6 with a total of 48 field facets 7, which can each be switched between three different tilt positions.

In an alternative embodiment of the illumination optical unit 3, a field facet mirror 6 with seventy-two field facets 7, which can each be switched between two tilt positions, can also be assigned to the pupil facet mirror 10. In a further variant, the field facet mirror 6 can have thirty-six field facets 7, which can be switched between four tilt positions. In a further variant, the field facet mirror 6 can have seventy-two field facets 7, which can be switched between three tilt positions, with the pupil facet mirror 10 then having two hundred and sixteen pupil facets 11. In a further variant, the field facet mirror 6 can have forty-eight field facets 7, which can be switched between four tilt positions, with then one hundred and ninety-two pupil facets 11 being present on the pupil facet mirror 10.

FIG. 4 shows a "conventional illumination with small maximum illumination angle" illumination setting. The maximum illumination angle is prescribed by the impinged-upon pupil facets 11 which are furthest away from a center 24 of the pupil facet mirror 10.

FIG. 5 shows an "annular illumination-angle distribution with mid-sized maximum illumination angle" illumination setting. Here, the illumination light 3 impinges upon a ring of pupil facets 11, with pupil facets 11 which are not impinged upon remaining both within this ring and outside of this ring.

FIG. 6 shows the pupil facet mirror 10 with an "annular illumination-angle distribution with maximum illumination angle" illumination setting. Here, an outer ring of the pupil facets 11 on the pupil facet mirror 10 is impinged upon by the illumination light 3.

FIG. 7 shows a "y-dipole" illumination setting. Here, two pupil facet groups 25, 26 spaced apart from one another in the y-direction are impinged upon; the shape of the outer edge of the groups is reminiscent of that of a leaf from a deciduous tree, which is why such a pupil facet group is also referred to as a "leaflet".

FIG. 8 shows an "x-dipole" illumination setting with leaflets spaced apart from one another in the x-direction.

FIG. 9 shows a "+25°-dipole" illumination setting with leaflets, i.e. pupil facet groups 25, 26, twisted with respect to one another compared to the x-dipole according to FIG. 7 by 25° clockwise in the circumferential direction around the center 24 of the pupil facet mirror 10.

FIG. 10 shows a "−25°-dipole" illumination setting with leaflets twisted by −50° in the circumferential direction compared to the illumination setting according to FIG. 9.

Other dipole angles are also possible, for example +45° or −45°. A +α/−α-dipole setting is also referred to below in an abbreviated form as α-dipole setting.

FIG. 11 shows a variant of an assignment of pupil facet sets of in each case three pupil facets 11, which, corresponding to the three tilt positions, are assigned to exactly one of the field facets 7 in each case. Here, the same letters denote the membership of the same pupil facet set. The pupil facet mirror 10 has 144 pupil facets, as already explained above. FIG. 11 moreover indicates a subdivision of the support plate 10a of the pupil facet mirror 10 into four quadrants I, II, III, IV. The three pupil facets 11 which are arranged in the fourth row, tenth column, in the eleventh row, eighth column and in the eleventh row, thirteenth column for example belong to one and the same pupil facet set, characterized by the letter "A", i.e. they are impinged upon by the illumination light 3 via one and the same field facet 7, depending on the tilt position of this field facet 7.

Each of these pupil facet sets, i.e., for example, also the pupil facet set "AAA", is associated with a symmetry set of the pupil facets 11, which is arranged with point symmetry to this pupil facet set in relation to the center 24 of the pupil facet mirror 10. In the case of the pupil facet set "AAA", the symmetry set is the pupil facet set "aaa".

The assignment of all pupil facets 11 to the pupil facet sets, i.e., for example, to the sets "AAA" and "aaa", can be such that the pupil facets 11 in each of these pupil facet sets AAA, BBB . . . aaa, bbb . . . prescribe the corners of an acute-angled triangle 27. These triangles 27 are plotted in FIG. 11 for the sets "AAA" and "aaa".

When assigning the field facets 7 to the pupil facets 11, which results in the prescription of the position of the respective pupil facets 11 of the various pupil facet sets, initially those pupil facets groups are prescribed on the pupil facet mirror 10 onto which, proceeding from different field facets 7, the EUV illumination light 3 should be deflected. Thus, in this prescription, a decision is initially made as to what illumination settings should be generated on the pupil facet mirror 10. In the illustrated embodiment, these are the illumination settings according to FIGS. 4 to 10. Subsequently, the field facets 7 are assigned to the pupil facets 11, with there being a corresponding prescription of arrangements of the pupil facet sets on the pupil facet mirror 10 such that only pupil facets from different pupil facet sets are arranged in each illumination setting group of the pupil facets 11. In the assignment according to FIG. 11, this is clearly shown for the illumination settings according to FIGS. 4 to 10 in FIGS. 12 to 18, which show the respective partial assignments of the pupil facets 11 to the field facets 7 in respectively exactly one of the three possible tilt positions such that this results in the desired illumination setting.

Figure 12:
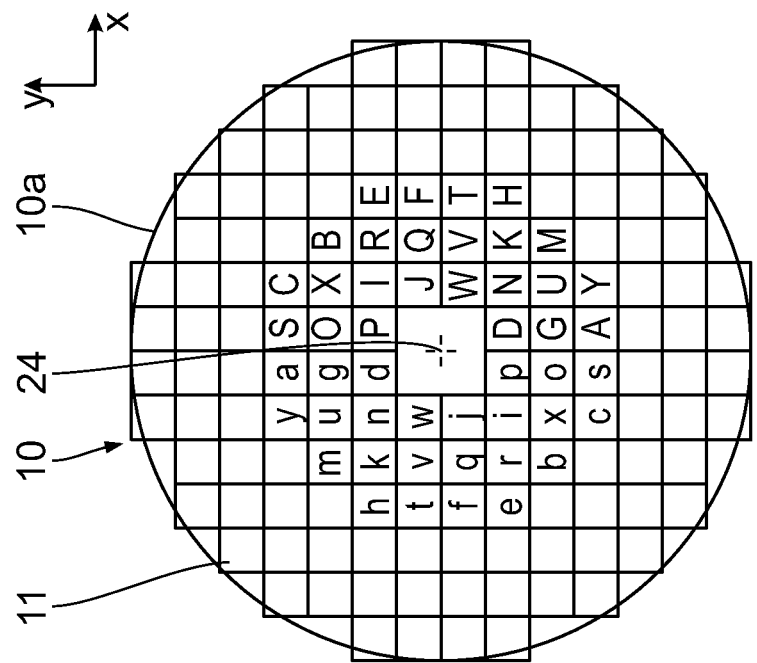
Figure 13:
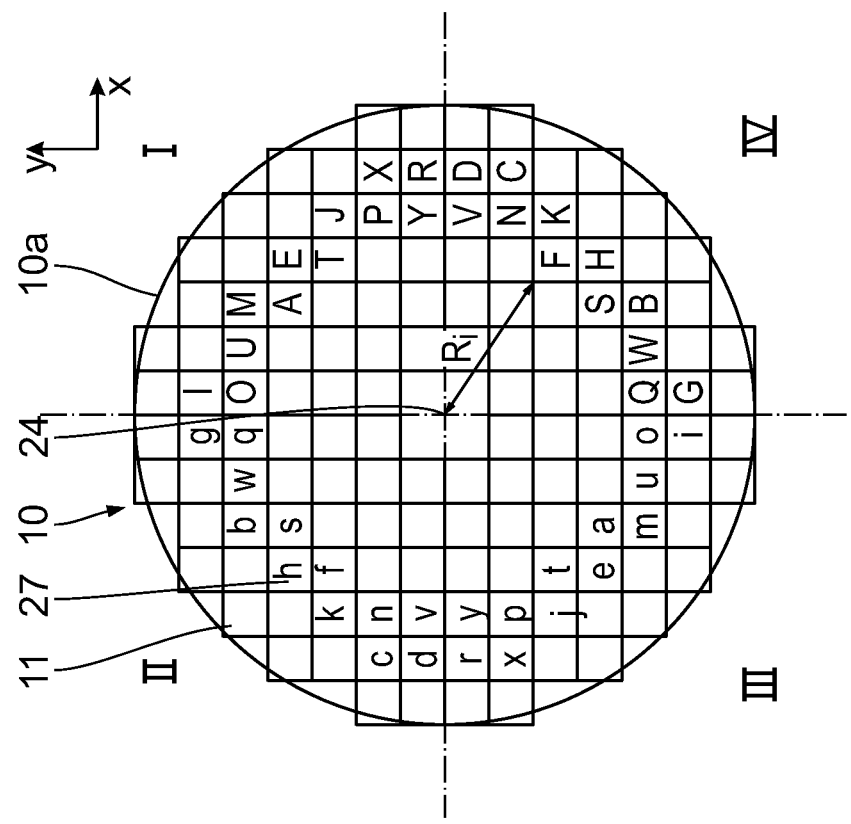
Figure 16:
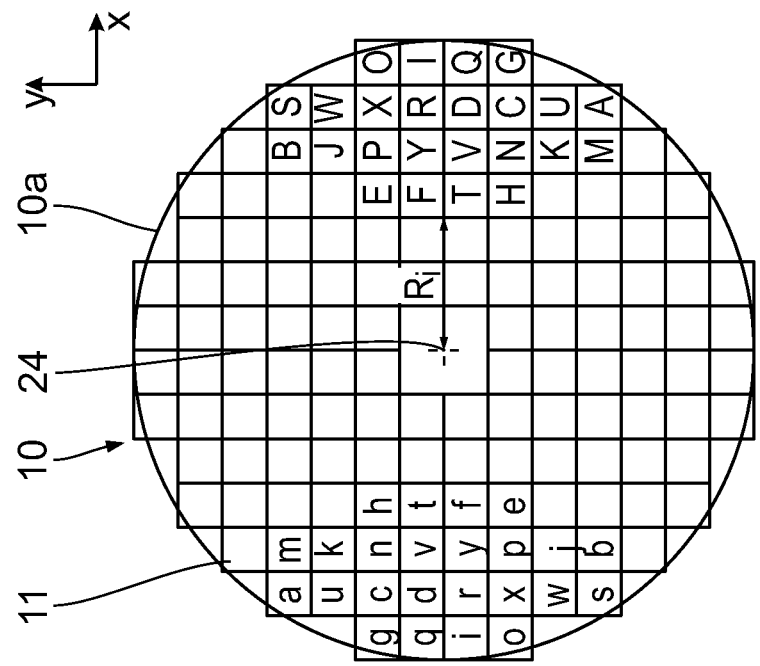
Figure 15:
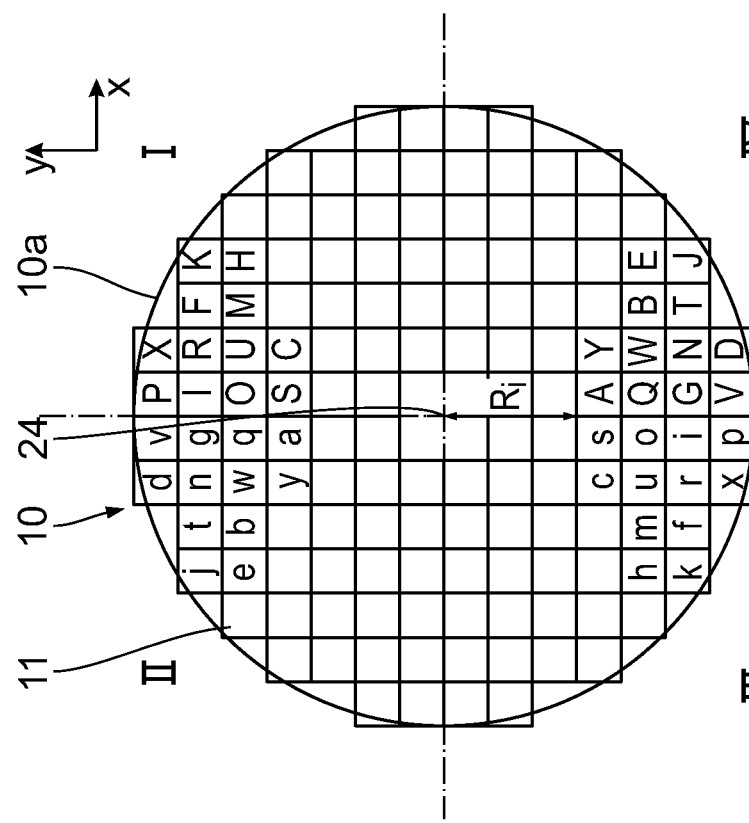
Figure 18:
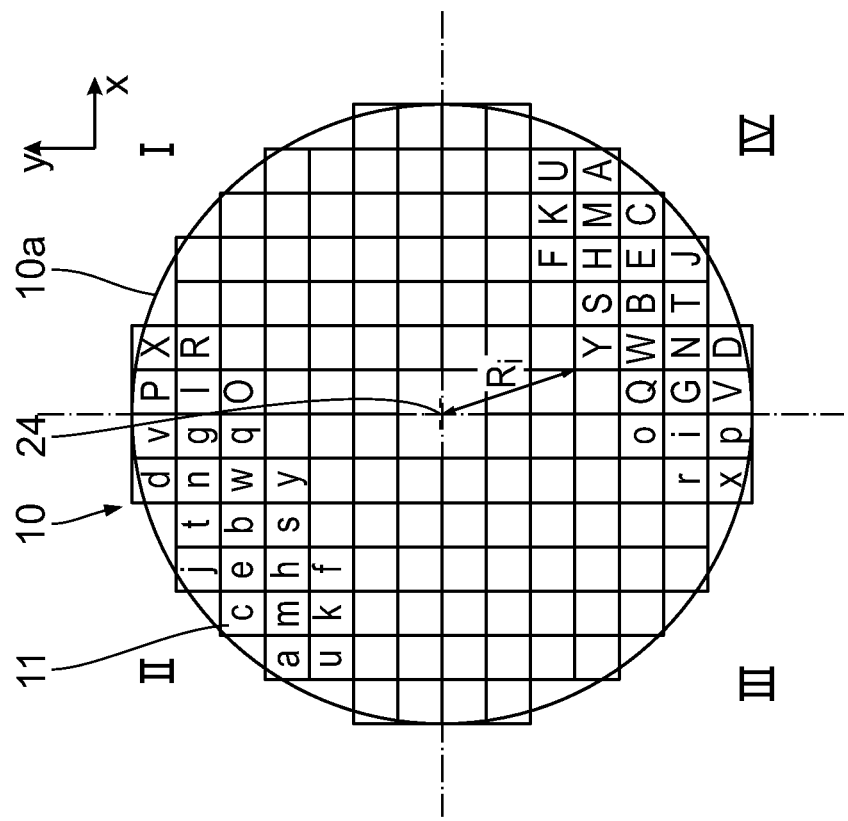
Figure 17:
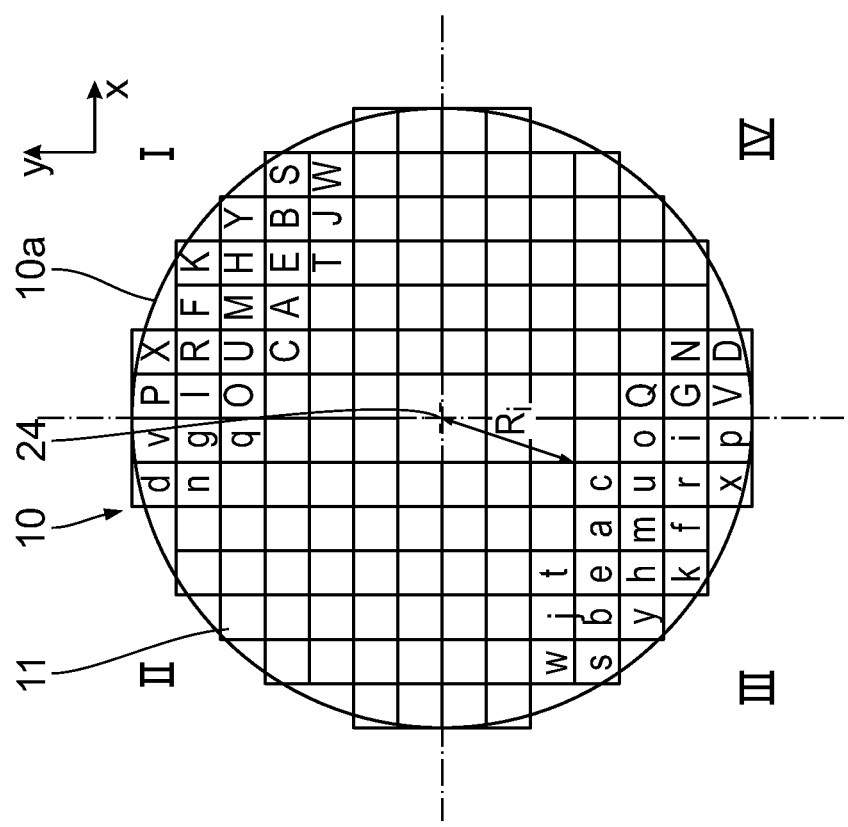

FIG. 12 shows the illumination setting according to FIG. 4, FIG. 13 shows the illumination setting according to FIG. 5, and so on. In each of the pupil facet groups depicted in FIGS. 12 to 18, there is no occurrence of two lowercase letters that are the same and also no occurrence of two uppercase letters that are the same. Thus, it is ensured that, simultaneously, all pupil facets 11 of each illumination setting group can be impinged upon via the field facet mirror 6 with the tiltable field facets 7.

By way of example, the arrangement distributions according to FIGS. 14 to 18 of the pupil facets 11 have innermost pupil facets 11 which lie on a radius $R_i$ around the center 24 of the pupil facet mirror 10, which radius is greater than 42% of the overall diameter of the carrier plate 10a of the pupil facet mirror 10.

The point symmetry of the pupil facet sets in relation to one another, which was explained above using the example of the sets "AAA" and "aaa", renders it possible to carry out the assignment method for only half of the pupil facets 11 on the pupil facet mirror 10 since the second half then emerges on account of the point symmetry of the assignment. In the example of the assignment according to FIG. 11, it is therefore for example sufficient to allocate the uppercase letters, as a result of which the position of the lowercase letters is immediately set unambiguously due to the point symmetry.

If a possible assignment was found, for example the assignment according to FIG. 11, the assignment can be refined further in order to optimize the tilt angles of the field facets 7. To this end, the pupil facets 11 are arranged within each of the pupil facet sets in such a way that a maximum distance between the pupil facets 11 within the pupil facet sets is minimized for all sets. In particular, the optimization is carried out in such a way that the pupil facets 11 within each of the pupil facet sets are arranged such that the pupil facets 11 of the pupil facet sets are arranged within circular areas on the pupil facet support 10a with a radius minimized for all pupil facet sets.

This will be described in an exemplary manner below on the basis of FIGS. 19 and 20. FIG. 19 shows the assignment according to FIG. 11 and shows, for a selected pupil facet set "YYY", an arc 28 of the smallest circle within which the three pupil facets 11 of the pupil facet set "YYY" are arranged.

FIG. 20 shows an assignment in which two of the pupil facets 11, which are denoted by 11i in FIGS. 19 and 20, have been exchanged between the sets "YYY" and "yyy". The two pupil facets 11i have point symmetry with respect to one another.

The resultant pupil facet sets "YYY" and "yyy", which are highlighted in FIG. 20, remain point symmetrical with respect to one another. The pupil facets 11 within the respective pupil facet sets "YYY" and "yyy" now lie closer together, and so an optimized arc 29, which prescribes the smallest circle on which all three pupil facets 11 of the set "YYY" lie, now has a smaller radius than the arc 28 of the assignment according to FIG. 19. As a result, the pupil facets 11 of the sets "YYY" and "yyy" can be actuated, i.e. impinged upon by the illumination light 3, via smaller tilt position changes of the respectively assigned field facet 7, i.e. via smaller tilt angles.

The two facet mirrors, i.e. the field facet mirror 6 and the pupil facet mirror 10, are arranged in such a way that an arrangement distribution of the second facets, i.e. the pupil facets 11, which can be actuated by the EUV radiation or the EUV illumination light 3 at a given tilt position configuration of the first facets, i.e. the field facets 7, results in an illumination-angle distribution of an illumination of the illumination field 18. The pupil facets 11, which belong to each of the pupil facet sets, e.g. "AAAA", lie within circles, e.g. the circles prescribed by the arcs 28 and 29, on the pupil facet mirror 10, the diameter of which is less than 70% of an overall diameter of an overall arrangement of all pupil facets 11 on the pupil facet mirror 10, i.e. of the diameter of the carrier plate 10a of the pupil facet mirror 10.

An overall reflection area of connected pupil facet groups of these arrangement distributions according to FIGS. 14 to 18 is less than 40% of an overall reflection area of the overall arrangement of the pupil facets 11. The arrangement distributions of the pupil facets 11 according to, on the one hand, FIGS. 15, 17 and 18 and, on the other hand, FIGS. 16, 17 and 18 differ, in particular in relation to the number of the pupil facets 11 belonging in each case to the arrangement distributions, by at least 5% in all four quadrants I to IV of the overall arrangement of all pupil facets 11. The arrangement distribution according to FIG. 15 for example has exactly 12 illuminated pupil facets 11 in all four quadrants I to IV; these are highlighted by the respective letters. The arrangement distribution according to FIG. 17 has a total of 19 illuminated pupil facets in quadrant I and in quadrant III and in each case exactly five illuminated pupil facets 11 in quadrants II and IV. The arrangement distribution according to FIG. 18 has exactly five illuminated pupil facets 11 in quadrants I and III and exactly 19 illuminated pupil facets 11 in quadrants II and IV. In respect of the number of pupil facets 11 in the various arrangement distributions in quadrants I to IV, the difference is even substantially greater than 5%, greater than 10%, greater than 15%, greater than 20%, greater than 30%, greater than 40% and, in the case of the arrangement distributions mentioned above, even greater than 50%.

In an illumination optical unit with a variant of the pupil facet mirror 10, which is explained below on the basis of FIGS. 21 to 30, the illumination optical unit has a field facet mirror 6 with field facets 7, which can be switched between four different tilt positions in each case. The pupil facet mirror 10 according to FIGS. 21 to 30 has a total of 416 pupil facets 11.

FIG. 21 shows a variant of an assignment of pupil facet sets of in each case four pupil facets 11, which are assigned to the four tilt positions of in each case exactly one of the field facets 7. Here, the same letters denote membership of the same pupil facet set. Examples of such pupil facet sets are the sets AAAA, aaaa, A'A'A'A' and a'a'a'a', which include the pupil facets 11 highlighted with shading in FIG. 21. The four pupil facets 11 which are arranged on the pupil facet mirror 10 in the $12^{th}$ row, $7^{th}$ column, in the $15^{th}$ row, $4^{th}$ column, in the $20^{th}$ row, $4^{th}$ column and in the $19^{th}$ row, $15^{th}$ column for example belong to one and the same pupil facet set, characterized by the letter "A", i.e. they are impinged upon by illumination light 3 via one and the same field facet 7, depending on the tilt position of this field facet 7.

A symmetry set of the pupil facets 11, which is arranged with point symmetry to a given pupil facet set in relation to the center 24 of the pupil facet mirror 10, is associated with each of the pupil facet sets "AAAA" to "ZZZZ" and "A'A'A'A'" to "Z'Z'Z'Z'", i.e. for example also to the pupil facet set "AAAA". In the case of the pupil facet set "AAAA", the symmetry set is the pupil facet set "aaaa". Corresponding symmetry assignments apply, for example, to the sets "C'C'C'C'" and "c'c'c'c'", and "MMMM" and "mmmm".

The assignment of all pupil facets 11 to the pupil facet sets, i.e., for example, to the sets "AAAA" and "A'A'A'A'", can be such that the pupil facets 11 of each of these pupil facet sets AAAA, A'A'A'A', aaaa, a'a'a'a' prescribe the corners of a convex polygon, in this case the corners of a convex quadrilateral 30. These quadrilaterals 30 are plotted in FIG. 21 for the sets "AAAA" and "A'A'A'A'".

The field facets 7 are assigned to the pupil facets 11 as already explained above on the basis of, for example, the embodiment according to FIGS. 11 to 19. FIG. 21 shows the result of such an assignment of the pupil facets 11 of the pupil facet mirror 10 for the field facet mirror 6 with field facets 7 that can each be switched between four tilt positions.

FIGS. 22 to 29 constitute examples of illumination settings, which show respective partial assignments of the pupil facets 11 to the field facets 7 in, in each case, exactly one of the four possible tilt positions such that this results in the desired illumination setting.

Figure 22:
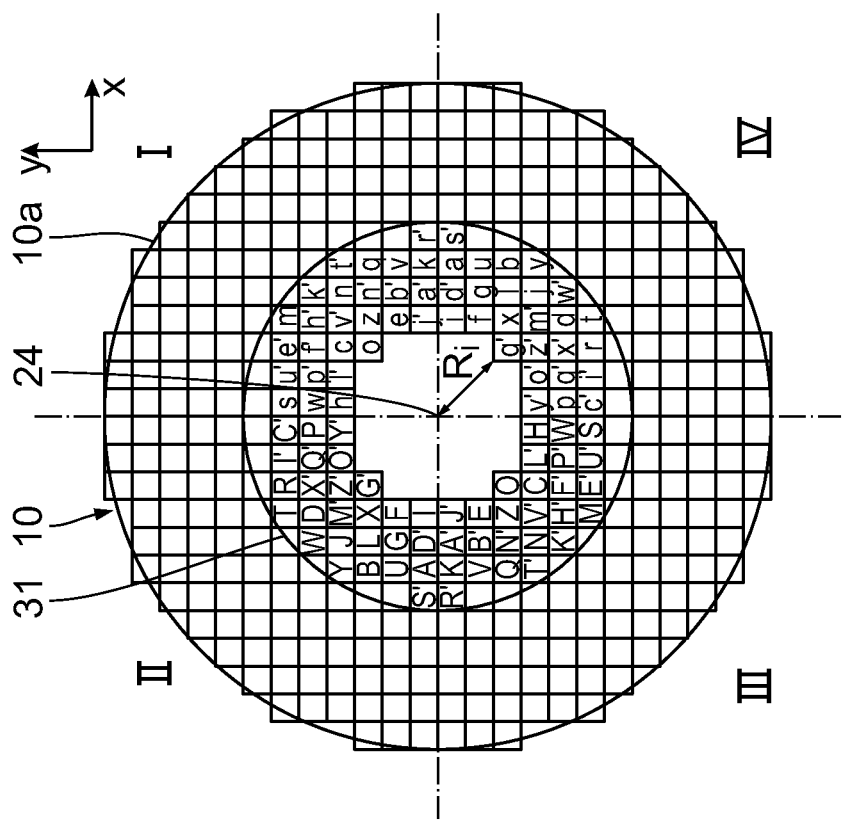
Figure 23:
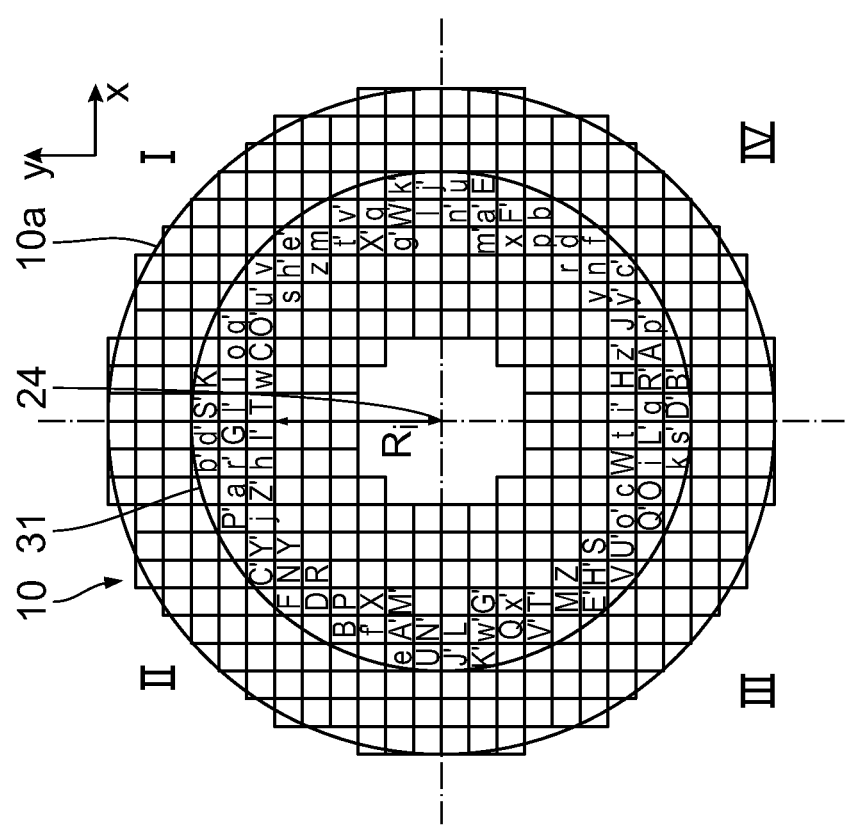

FIG. 22 shows an illumination setting which is similar to the one according to FIGS. 4 and 12. The illuminated pupil facets 11 lie within a circle 31 on the pupil facet mirror 10, the diameter of which is approximately 60% of an overall diameter of the support plate 10a. That is to say, the object field 18 is illuminated from illumination angles which, in accordance with this diameter ratio of 60%, are smaller than a maximum achievable illumination angle, which would be achieved by illuminating the outermost pupil facets 11 lying in the region of the overall diameter of the carrier plate 10a. This ratio specification is also denoted "sigma". A definition of this value "sigma" is found in U.S. Pat. No. 6,658,084 B2. In the illumination setting according to FIG. 22, sigma<0.6 applies. FIG. 22 shows a "conventional illumination with small maximum illumination angle" illumination setting. FIG. 23 shows, correspondingly, an illumination setting with 0.5<sigma<0.7. FIG. 23 shows an "annular illumination-angle distribution with mid-sized maximum illumination angle" illumination setting.

Figure 24:
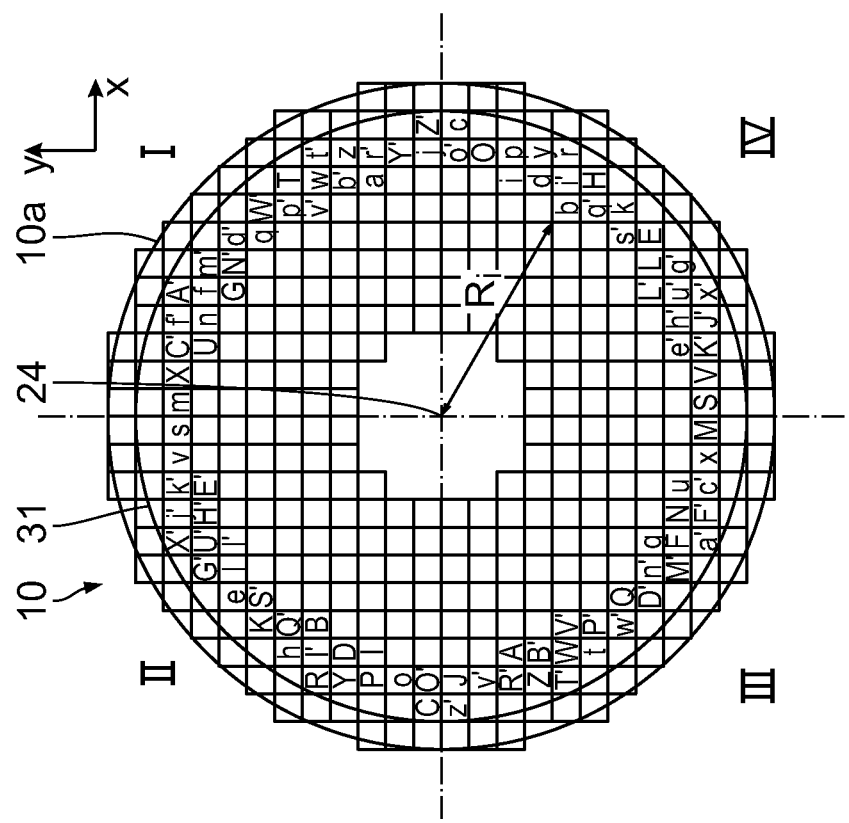

FIG. 24 shows an illumination setting with 0.7<sigma<0.85. This is an "annular illumination-angle distribution with larger maximum illumination angle" illumination setting.

Figure 25:
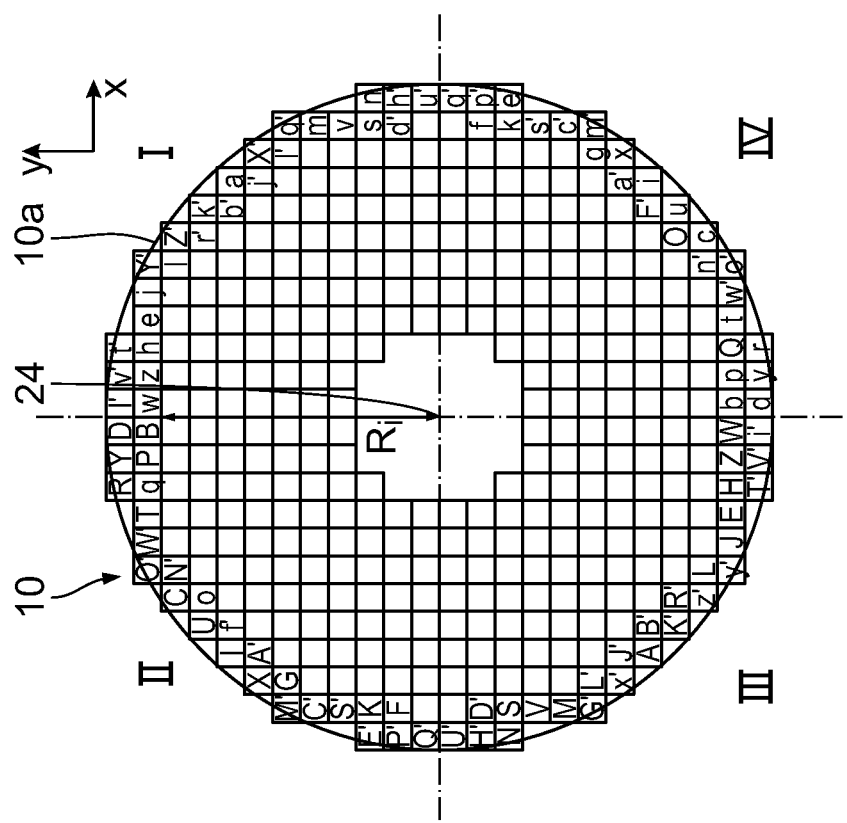

FIG. 25 shows an illumination setting with sigma>0.85. This is an "annular illumination-angle distribution with large maximum illumination angle" illumination setting.

Figure 26:
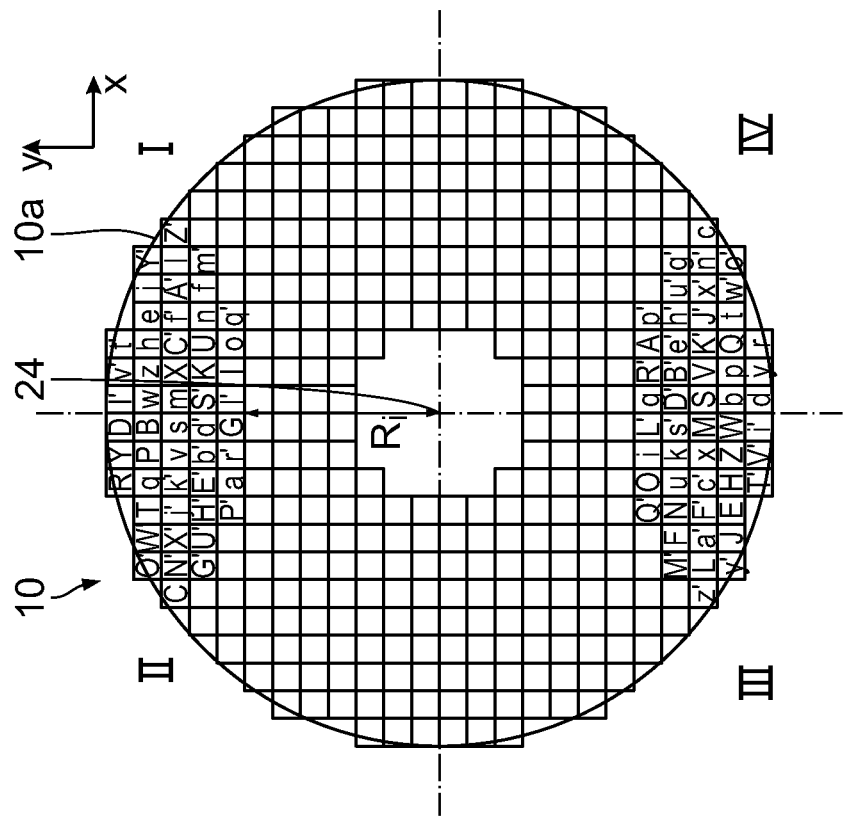
Figure 27:
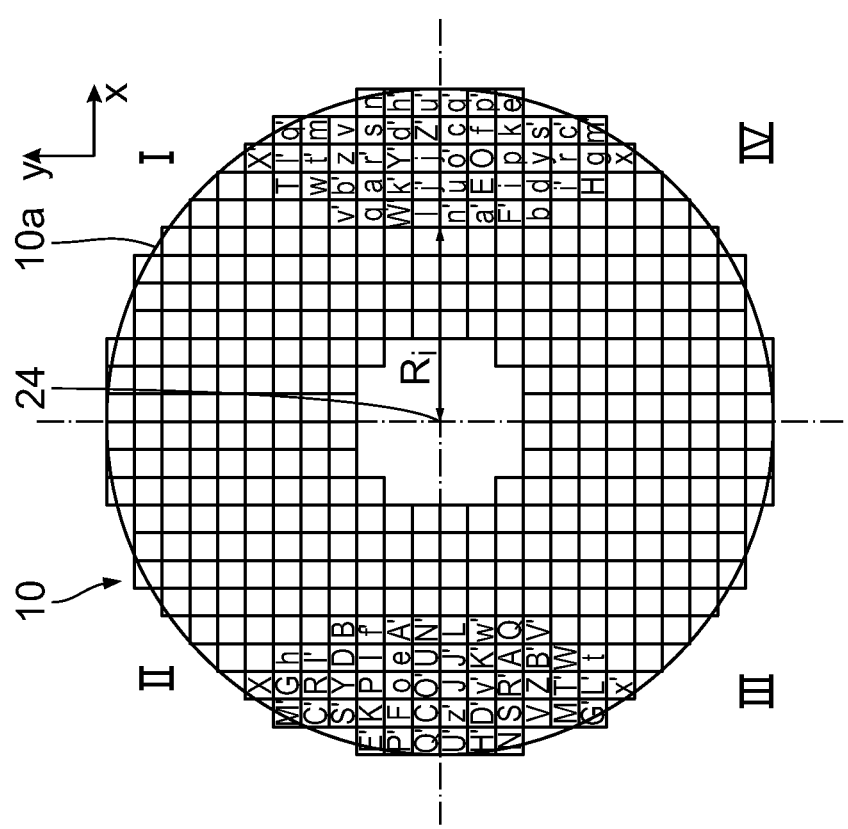
Figure 30:
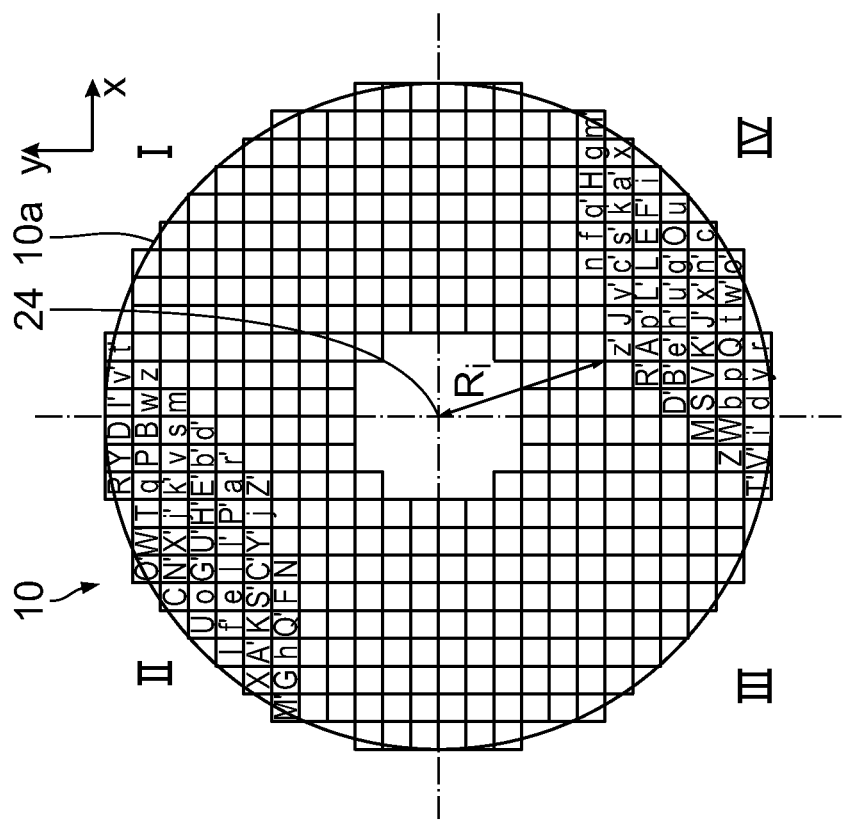
Figure 29:
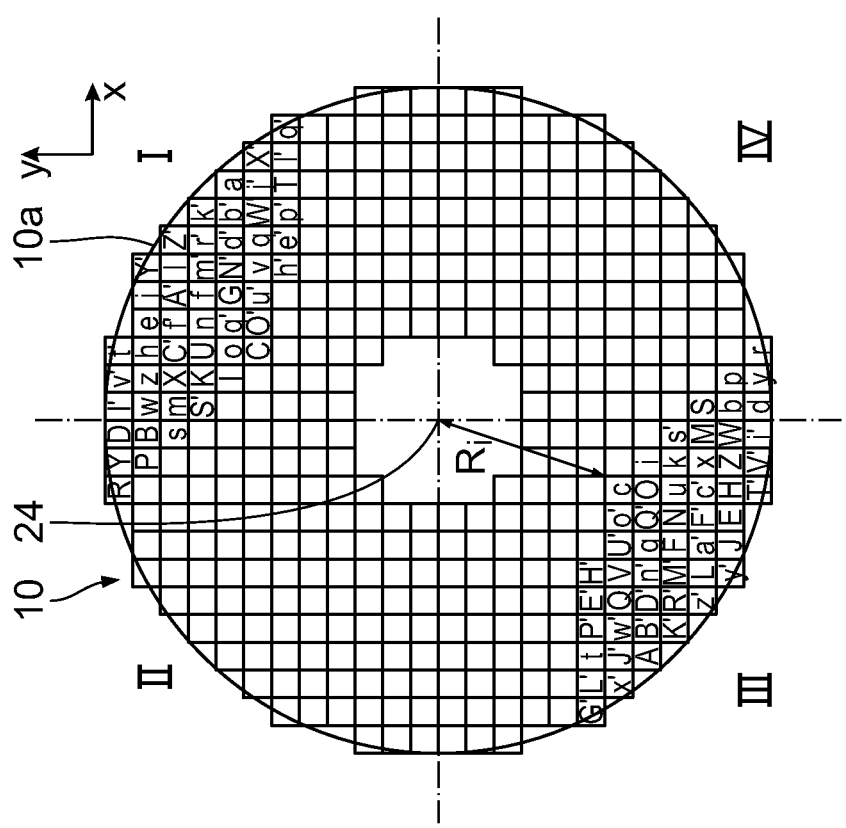

FIGS. 26 and 27 as well as FIGS. 29 and 30 show corresponding "y-dipole", "x-dipole", "+25°-dipole" and "−25°-dipole" illumination settings, corresponding to the illumination settings which were already explained above, for example in the context of FIGS. 7 to 10.

Figure 28:
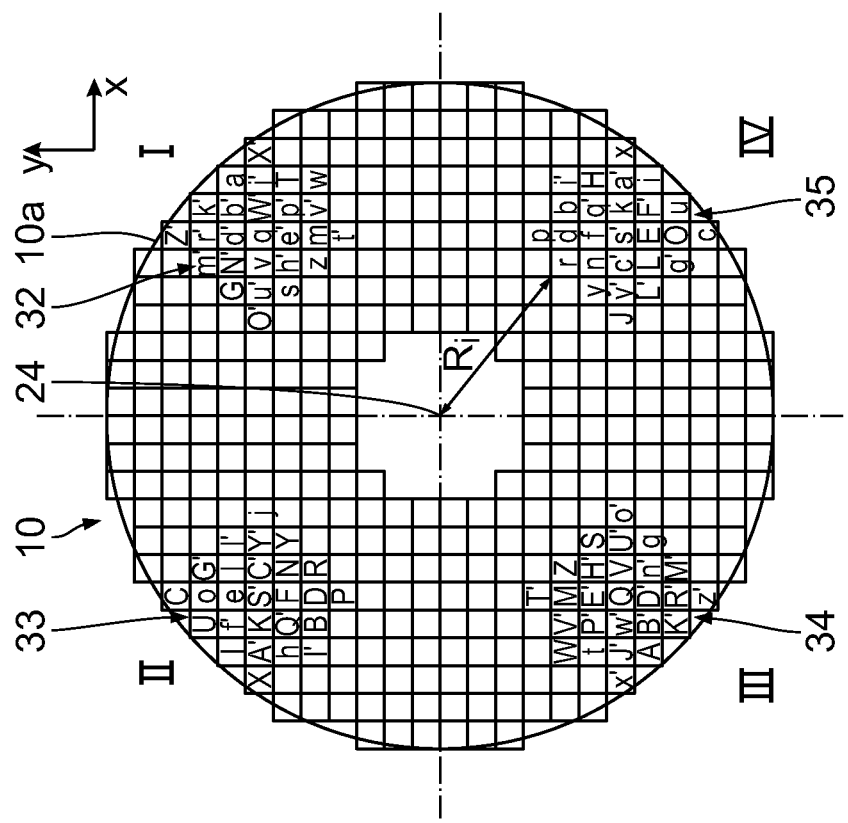

FIG. 28 shows a quadrupole illumination setting with, overall, four connected poles 32, 33, 34 and 35 of connected pupil facet groups. These four pupil facet groups 32 to 35 are each arranged in one of the quadrants I to IV of the pupil facet mirror 10. In the circumferential direction around the center 24 of the pupil facet mirror 10, the four poles 32 to 35 lie centered around the positions +45°, +135°, +225°, +315°. Each one of the four poles 32 to 35 contains 26 illuminated pupil facets 11. Sigma>0.5 applies for each one of the poles.

In the embodiment according to FIGS. 21 to 30, the two facet mirrors 6, 10 are also arranged in such a way that the pupil facets 11, which belong to each of the sets, for example AAAA and A'A'A'A' of the pupil facets 11, lie within circles on the pupil facet mirror 10, the diameter of which is less than 70% of the overall diameter of the overall arrangement of the pupil facets 11, i.e. of the overall diameter of the carrier plate 10a. By way of example, this overall diameter is denoted by GD in FIGS. 19 and 21. Corresponding arcs of circles, within which the pupil facet sets AAAA and A'A'A'A' lie, are plotted at 36 and 37 in FIG. 21. Many of the arrangement arcs of the pupil facet sets are substantially smaller than 70% of the overall diameter of the carrier plate 10a in the arrangement according to FIG. 21, for example smaller than 60%, smaller than 50% or even smaller still.

The arrangement distributions of the illuminated pupil facets 11 according to FIGS. 24 to 30 are in turn such that the illuminated innermost pupil facets 11, as seen from the center 24 of the pupil facet mirror 10, lie on a radius which is greater than 42% and also greater than 50% of half the overall diameter GD of the carrier plate 10a of the pupil facet mirror 10. This radius of the innermost pupil facets 11, i.e. of the innermost second facets, is denoted by $R_i$ in FIGS. 13 to 18 and 26 to 30.

In all illumination settings according to FIGS. 22 to 30, the overall reflection area of connected pupil facet groups, i.e. for example of the individual poles of the pole settings according to FIGS. 26 to 30, is less than 40% of an overall reflection area of the pupil facets 11 on the carrier plate 10a.

The illumination settings according to FIGS. 26 to 30 are examples of arrangement distributions of illuminated pupil facets 11, which, in terms of their reflection areas, respectively in all quadrants I to IV of the overall arrangement of the pupil facets 11 on the pupil facet mirror 10, differ from one another by at least 5%. The illumination settings according to FIGS. 26 and 27 in each case have twenty-six illuminated pupil facets 11 in all quadrants I to IV. The quadrupole illumination setting according to FIG. 28 likewise in each case has twenty-six illuminated pupil facets 11 in each quadrant I to IV. The illumination setting according to FIG. 29 in each case has forty-six illuminated pupil facets 11 in quadrants I and III and in each case has six illuminated pupil facets 11 in quadrants II and IV. The illumination setting according to FIG. 30 in each case has six illuminated pupil facets 11 in quadrants I and III and in each case has forty-six illuminated pupil facets 11 in quadrants II and IV. It is also true in this case that the number of pupil facets 11 associated with the respective arrangement distributions in each case differs from one another by substantially more than 5% in all quadrants I to IV, namely, once again, by more than 50%.

During the projection exposure, firstly the reticle 17 and the wafer 22 bearing a coating that is light-sensitive to the illumination light 3 are provided. Subsequently, a section of the reticle 17 is projected onto the wafer 22 with the aid of the projection exposure apparatus 1. Finally, the light-sensitive layer exposed by the illumination light 3 on the wafer 22 is developed. A microstructured or nanostructured component, for example a semiconductor chip, is produced in this way.

The invention claimed is:

1. An illumination optical unit configured to illuminate an illumination field, the illumination optical unit comprising:
   a first facet mirror comprising a plurality of first reflecting facets; and
   a second facet mirror comprising a plurality of second reflecting facets,
   wherein:
   at least some of the first reflecting facets are tiltable between various tilt positions;
   for each of at least some of the tiltable first reflecting facets, in each tilt position the first reflecting facet is assigned a second reflecting facet configured to deflect EUV radiation in a direction of a second reflecting facet;

each tiltable first reflecting facet is assigned to a set of second reflecting facets by its tilt positions;

the first and second facet mirrors are configured so that an arrangement distribution of second reflecting facets, on which EUV radiation is impingable in a given tilt position configuration of the first reflecting facets, results in an illumination-angle distribution of an illumination of the illumination field;

for at least one set of second reflecting facets, the second reflecting facets belonging to the set of second reflecting facets lie within a circle on the second facet mirror;

the diameter of the circle is less than 70% of an overall diameter of an overall arrangement of all second facets on the second facet mirror; and the illumination optical unit is a microlithography illumination optical unit.

2. The illumination optical unit of claim 1, wherein:
a symmetry set of the second reflecting facets belongs to each of the sets of the second facets; and
in relation to a center of the second facet mirror, the symmetry set is arranged with point symmetry with respect to the set of the second reflecting facets.

3. The illumination optical unit of claim 2, wherein every set of the second reflecting facets comprises more than two second reflecting facets.

4. The illumination optical unit of claim 3, wherein:
for at least three arrangement distributions of the second reflecting facets, the innermost second reflecting facets of the arrangement distribution as seen from a center of the second facet mirror lie on a radius which is greater than 42% of half the overall diameter of the overall arrangement of all second reflecting facets on the second facet mirror;
an overall reflection area of connected pupil facet groups of the arrangement distributions of the second reflecting facets is less than 40% of an overall reflection area of the overall arrangement of all second reflecting facets; and
at least three of the arrangement distributions differ from one another by at least 5% in terms of their reflection areas in each case in all quadrants of the overall arrangement of all second reflecting facets.

5. The illumination optical unit of claim 3, wherein each set of second reflecting facets comprises exactly three second facets.

6. The illumination optical unit of claim 3, wherein the second reflecting facets of each set prescribe the corners of a convex polygon.

7. The illumination optical unit of claim 1, wherein every set of the second reflecting facets comprises more than two second reflecting facets.

8. The illumination optical unit of claim 7, wherein:
for at least three arrangement distributions of the second reflecting facets, the innermost second reflecting facets of the arrangement distribution as seen from a center of the second facet mirror lie on a radius which is greater than 42% of half the overall diameter of the overall arrangement of all second reflecting facets on the second facet mirror;
an overall reflection area of connected pupil facet groups of the arrangement distributions of the second facets is less than 40% of an overall reflection area of the overall arrangement of all second reflecting facets; and
at least three of the arrangement distributions differ from one another by at least 5% in terms of their reflection areas in each case in all quadrants of the overall arrangement of all second reflecting facets.

9. The illumination optical unit of claim 7, wherein each set of second reflecting facets comprises exactly three second facets.

10. The illumination optical unit of claim 7, wherein the second reflecting facets of each set prescribe the corners of a convex polygon.

11. The illumination optical unit of claim 1, wherein:
for at least three arrangement distributions of the second reflecting facets, the innermost second reflecting facets of the arrangement distribution as seen from a center of the second facet mirror lie on a radius which is greater than 42% of half the overall diameter of the overall arrangement of all second reflecting facets on the second facet mirror;
an overall reflection area of connected pupil facet groups of the arrangement distributions of the second facets is less than 40% of an overall reflection area of the overall arrangement of all second reflecting facets; and
at least three of the arrangement distributions differ from one another by at least 5% in terms of their reflection areas in each case in all quadrants of the overall arrangement of all second reflecting facets.

12. The illumination optical unit of claim 11, wherein each set of second reflecting facets comprises exactly three second facets.

13. The illumination optical unit of claim 11, wherein the second reflecting facets of each set prescribe the corners of a convex polygon.

14. A method, comprising:
providing the illumination optical unit of claim 1;
prescribing groups of second reflecting facets on the second facet mirror onto which, proceeding from different first reflecting facets, EUV radiation can be deflected; and
assigning the first facets to the second reflecting facets while correspondingly prescribing arrangements of sets of second reflecting facets so that only reflecting facets from different sets of second reflecting facets are arranged in each group.

15. The method of claim 14, wherein the second reflecting facets within each set of the second reflecting facets are arranged to minimize a maximum distance between the second reflecting facets in the respective set of second reflecting facets.

16. The method of claim 14, wherein the second reflecting facets within each set of second reflecting facets are arranged so that, for all sets of second reflecting facets, the second reflecting facets are arranged within circular areas with a radius minimized for all sets of second reflecting facets.

17. The method of claim 14, wherein the second reflecting facets within each set of second reflecting facts are arranged so that, for all sets of second reflecting facets, the second reflecting facets prescribe corners of convex polygons.

18. The method of claim 14, wherein arrangements of second reflecting facets which lead to at least some of the following illumination settings are prescribed as the groups of second reflecting facets: annular illumination with small illumination angles; annular illumination with mid-sized illumination angles; annular illumination with large illumination angles; x-dipole setting; y-dipole setting; +a-dipole setting; −α-dipole setting; quadrupole setting;

hexapole setting; and conventional setting.

19. An optical system, comprising:
an EUV light source; and
an illumination optical unit according to claim 1.

20. An apparatus, comprising:
an illumination optical unit according to claim 1; and
a projection optical unit,
wherein the apparatus is a microlithography projection exposure apparatus.

21. A method of using an apparatus comprising an illumination optical unit and a projection optical unit, the method comprising:
using the illumination optical unit to illuminate a reticle comprising structures; and
using the projection optical unit to project at least part of the illuminated reticle onto a light-sensitive material,
wherein the projection optical unit comprises an illumination optical unit according to claim 1.

22. The illumination optical unit of claim 1, wherein, for each set of second reflecting facets, the second reflecting facets belonging to the set of second reflecting facets lie within a circle on the second facet mirror.

23. The illumination optical unit of claim 22, wherein:
a symmetry set of the second reflecting facets belongs to each of the sets of the second facets; and
in relation to a center of the second facet mirror, the symmetry set is arranged with point symmetry with respect to the set of the second reflecting facets.

24. The illumination optical unit of claim 22, wherein the second reflecting facets of each set prescribe the corners of a convex polygon.

25. The illumination optical unit of claim 22, wherein every set of the second reflecting facets comprises more than two second reflecting facets.

26. The illumination optical unit of claim 22, wherein each set of second reflecting facets comprises exactly three second facets.

27. The illumination optical unit of claim 22, wherein the second reflecting facets of each set prescribe the corners of a convex polygon.

28. The illumination optical unit of claim 22, wherein:
for at least three arrangement distributions of the second reflecting facets, the innermost second reflecting facets of the arrangement distribution as seen from a center of the second facet mirror lie on a radius which is greater than 42% of half the overall diameter of the overall arrangement of all second reflecting facets on the second facet mirror;
an overall reflection area of connected pupil facet groups of the arrangement distributions of the second facets is less than 40% of an overall reflection area of the overall arrangement of all second reflecting facets; and
at least three of the arrangement distributions differ from one another by at least 5% in terms of their reflection areas in each case in all quadrants of the overall arrangement of all second reflecting facets.

* * * * *